(12) United States Patent
Lee et al.

(10) Patent No.: US 12,740,200 B2
(45) Date of Patent: Sep. 15, 2026

(54) DISPLAY DEVICE

(71) Applicant: Samsung Display Co., LTD., Yongin-si (KR)

(72) Inventors: Ji Hye Lee, Hwaseong-si (KR); Jin Seon Kwak, Hwaseong-si (KR); Kyung Bae Kim, Seongnam-si (KR); Yong Hee Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 739 days.

(21) Appl. No.: 17/968,353

(22) Filed: Oct. 18, 2022

(65) Prior Publication Data

US 2023/0275196 A1 Aug. 31, 2023

(30) Foreign Application Priority Data

Feb. 25, 2022 (KR) ........................ 10-2022-0025148

(51) Int. Cl.
*H10H 20/851* (2025.01)
*G02B 5/20* (2006.01)
(Continued)

(52) U.S. Cl.
CPC ......... *H10H 20/8514* (2025.01); *G02B 5/201* (2013.01); *H10H 29/142* (2025.01)

(58) Field of Classification Search
CPC .. H10H 20/8514; H10H 20/819; H10H 20/84; H10H 20/8513; H10H 20/855;
(Continued)

(56) References Cited

U.S. PATENT DOCUMENTS 11,394,008 B2 7/2022 Akagawa et al.
11,621,305 B2 4/2023 Park et al.
(Continued)

FOREIGN PATENT DOCUMENTS

EP 4 071 824 10/2022
EP 4 084 081 11/2022
(Continued)

OTHER PUBLICATIONS

WO 2022004958 A1—Kim—Translated (Year: 2022).*
Extended European Search Report for European Application No. 23158612.4, dated Jul. 12, 2023.

*Primary Examiner* — Joshua Benitez Rosario
*Assistant Examiner* — Moataz Khalifa
(74) *Attorney, Agent, or Firm* — Womble Bond Dickinson (US) LLP

(57) ABSTRACT

A display device includes a substrate including a display area and a non-display area surrounding the display area, a plurality of sub-pixels including a first sub-pixel and a second sub-pixel, an upper bank layer surrounding the sub-pixels and the display area, a plurality of color control members including a first wavelength conversion layer in the first sub-pixel and a second wavelength conversion layer in the second sub-pixel, a plurality of color filter layers including a first color filter layer on the first wavelength conversion layer, and a second color filter layer on the second wavelength conversion layer, and a third color filter layer, a dam member surrounding the display area in the non-display area, and a valley between the dam member and the upper bank layer and surrounding the display area. The third color filter layer is on the first color filter layer in the non-display area.

16 Claims, 16 Drawing Sheets

(51) Int. Cl.

| | |
|---|---|
| ***H10H 20/819*** | (2025.01) |
| ***H10H 20/831*** | (2025.01) |
| ***H10H 20/84*** | (2025.01) |
| ***H10H 20/85*** | (2025.01) |
| ***H10H 20/855*** | (2025.01) |
| ***H10H 20/857*** | (2025.01) |
| ***H10H 29/14*** | (2025.01) |
| ***H10K 59/38*** | (2023.01) |
| ***H10W 90/00*** | (2026.01) |

(58) Field of Classification Search
CPC .. H10H 20/851; H10H 20/831; H10H 29/142; H01L 25/167; H10K 59/38; G02B 5/201
See application file for complete search history.

(56) References Cited

U.S. PATENT DOCUMENTS

| | | | | |
|---|---|---|---|---|
| 12,016,194 | B2 | 6/2024 | Park et al. | |
| 2020/0168685 | A1* | 5/2020 | Bang | H10D 86/443 |
| 2020/0227680 | A1* | 7/2020 | Akagawa | H10K 71/00 |
| 2021/0050388 | A1 | 2/2021 | Song | |
| 2021/0074770 | A1* | 3/2021 | Choe | G02B 5/206 |
| 2021/0109400 | A1 | 4/2021 | Kim et al. | |
| 2021/0126055 | A1 | 4/2021 | Lee et al. | |
| 2021/0324268 | A1* | 10/2021 | Yang | G02B 6/005 |
| 2022/0059799 | A1 | 2/2022 | Kim et al. | |
| 2023/0268469 | A1 | 8/2023 | Lee et al. | |
| 2024/0038943 | A1 | 2/2024 | Kim et al. | |
| 2024/0306420 | A1 | 9/2024 | Park et al. | |

FOREIGN PATENT DOCUMENTS

| | | | | |
|---|---|---|---|---|
| EP | 4235781 | A1 | 8/2023 | |
| JP | 6881476 | | 6/2021 | |
| KR | 10-2010-0004224 | | 1/2010 | |
| KR | 10-2020-0105598 | | 9/2020 | |
| KR | 10-2021-0031586 | A | 3/2021 | |
| KR | 10-2021-0146468 | A | 12/2021 | |
| KR | 10-2022-0019198 | A | 2/2022 | |
| WO | 2021/149863 | | 7/2021 | |
| WO | 2022/004958 | | 1/2022 | |
| WO | WO-2022004958 | A1 * | 1/2022 | H10K 59/875 |

* cited by examiner

DISPLAY DEVICE

CROSS-REFERENCE TO RELATED APPLICATION(S)

This application claims priority to and benefits of Korean Patent Application No. 10-2022-0025148 under 35 U.S.C. § 119, filed on Feb. 25, 2022, in the Korean Intellectual Property Office (KIPO), the entire contents of which are incorporated herein by reference.

BACKGROUND

1. Technical Field

Embodiments relate to a display device.

2. Description of the Related Art

The importance of display devices has steadily increased with the development of multimedia technology. Various types of display devices such as an organic light emitting display (OLED), a liquid crystal display (LCD) and the like have been used in various fields.

The display devices include a device for displaying an image such as a self-light emitting display device. The self-light emitting display device includes a light emitting element such as an organic light emitting display device formed of an organic material, an inorganic light emitting display device formed of an inorganic material, or the like.

SUMMARY

Embodiments provide a display device capable of reducing or minimizing a height difference between a display area and a non-display area.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device may include: a substrate including a display area and a non-display area surrounding the display area; a plurality of sub-pixels including a plurality of light emitting elements disposed on the substrate in the display area, the plurality of sub-pixels including a first sub-pixel and a second sub-pixel; an upper bank layer surrounding the plurality of sub-pixels and the display area; a plurality of color control members disposed in a region surrounded by the upper bank layer in each of the plurality of sub-pixels, the plurality of color control members including: a first wavelength conversion layer disposed in the first sub-pixel, and a second wavelength conversion layer disposed in the second sub-pixel different from the first sub-pixel; a plurality of color filter layers disposed on the plurality of color control members, the plurality of color filter layers including: a first color filter layer disposed on the first wavelength conversion layer, a second color filter layer disposed on the second wavelength conversion layer, and a third color filter layer; a dam member spaced apart from the upper bank layer, the dam member surrounding the display area in the non-display area; and a valley disposed between the dam member and the upper bank layer, the valley surrounding the display area, wherein the first color filter layer may extend from the display area to the non-display area, and the third color filter layer may be disposed on the first color filter layer disposed in the non-display area.

The first color filter layer and the third color filter layer may overlap each other in a thickness direction at a boundary area between the first sub-pixel and the non-display area.

The display device may further include a color pattern disposed between the first color filter layer and the third color filter layer at the boundary area between the first sub-pixel and the non-display area, wherein the color pattern and the second color filter layer may include a same colorant.

Each of the first color filter layer and the third color filter layer may extend to an outside of the dam member.

An outermost edge of the first color filter layer disposed in the non-display area may be spaced apart from an outermost edge of the third color filter layer disposed in the non-display area.

A distance between an outermost edge of the non-display area and the outermost edge of the first color filter layer may be smaller than a distance between the outermost edge of the non-display area and the outermost edge of the third color filter layer.

The outermost edge of the third color filter layer disposed in the non-display area may cover the outermost edge of the first color filter layer disposed in the non-display area, and the outermost edge of the third color filter layer may not overlap the outermost edge of the first color filter layer in a thickness direction.

The first color filter layer may include a red colorant, and the third color filter layer may include a blue colorant.

The dam member may be a single layer and disposed in the non-display area.

The plurality of sub-pixels may include a third sub-pixel different from the first sub-pixel and the second sub-pixel, the plurality of color control members may further include a light transmitting layer disposed in the third sub-pixel, and the third color filter layer may be disposed on the light transmitting layer in the third sub-pixel.

The display device may further include: a first capping layer disposed on the plurality of color control members and the upper bank layer; a low refractive layer disposed on the first capping layer; a second capping layer disposed on the low refractive layer; and a planarization layer disposed on the second capping layer, wherein the first capping layer, the second capping layer, and the planarization layer may be disposed across the display area and the non-display area.

The low refractive layer may be disposed in a region surrounded by the dam member, the first capping layer may be disposed on the valley and the dam member, and the second capping layer may be in direct contact with the first capping layer on the dam member.

The plurality of color filter layers may be disposed directly on the planarization layer, and the first color filter layer and the third color filter layer disposed in the non-display area may be disposed on the planarization layer at an outside of the dam member.

The display device may further include a bank layer surrounding each of the plurality of sub-pixels and the display area, wherein the upper bank layer may be disposed on the bank layer.

Each of the plurality of sub-pixels may include a first electrode and a second electrode spaced apart from each other in a region surrounded by the bank layer, and each of the plurality of light emitting elements of the plurality of sub-pixels may have a first end disposed on the first electrode and a second end disposed on the second electrode.

In an embodiment, a display device may include: a display area and a non-display area surrounding the display area; a plurality of sub-pixels disposed in the display area and arranged in a first direction and a second direction intersecting the first direction, each of the plurality of sub-pixels including: a first electrode, a second electrode spaced apart from the first electrode, and a light emitting element including a first end disposed on the first electrode and a second end disposed on the second electrode; an upper bank layer surrounding the display area, the upper bank layer surrounding a light transmitting area of each of the plurality of sub-pixels; a plurality of color filter layers disposed in the light transmitting area of each of the plurality of sub-pixels and in a light blocking area overlapping the upper bank layer around the light transmitting area of each of the plurality of sub-pixels; a dam member spaced apart from the upper bank layer and disposed in the non-display area, the dam member surrounding the display area; and a valley disposed between the dam member and the upper bank layer in a plan view, the valley surrounding the display area, wherein the plurality of color filter layers may include: a first color filter layer disposed in an outermost sub-pixel among the plurality of sub-pixels and extending to the non-display area, and a second color filter layer including a colorant different from a colorant of the first color filter layer, the second color filter layer disposed on the first color filter layer without being disposed in the light transmitting area of the outermost sub-pixel.

An outermost edge of the first color filter layer may be spaced apart from an outermost edge of the second color filter layer.

The outermost edge of the first color filter layer may be disposed at an outside of the dam member, and the outermost edge of the second color filter layer may be disposed between the dam member and the outermost edge of the first color filter layer in a plan view.

The first color filter layer and the second color filter layer may overlap each other in the light blocking area.

The display device may further include: a color pattern disposed between the first color filter layer and the second color filter layer in the light blocking area, wherein the color pattern may include a colorant different from colorants of the first color filter layer and the second color filter layer.

In the display device according to an embodiment, a color filter layer disposed in the display area may partially extend to the non-display area, and a height difference between the display area and the non-display area may be reduced. In the display device, in case that an optical film is provided, voids generated under the optical film in the non-display area may be prevented, and an appearance defect caused by the voids may not occur.

However, the effects of the disclosure are not limited to the aforementioned effects, and various other effects are included in the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
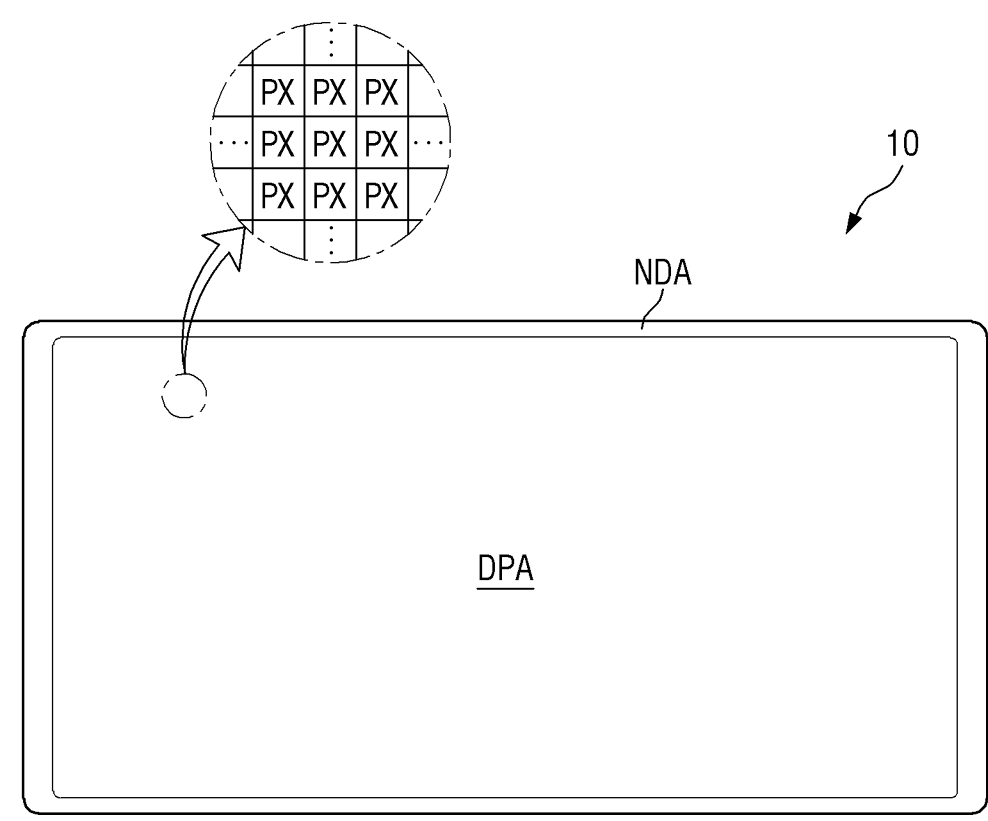
FIG. 1 is a schematic plan view of a display device according to an embodiment.
Figure 1:
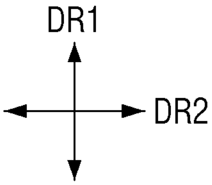

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, embodiments will be described with reference to the accompanying drawings.

FIG. 1 is a schematic plan view of a display device according to an embodiment.

Referring to FIG. 1, a display device 10 may display a moving image or a still image. The display device 10 may include any electronic device with a display screen. Examples of the display device 10 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which include a display screen.

The display device 10 may include a display panel which implements a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be described, but embodiments are not limited thereto, and other display panels may be applied.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (e.g., vertices), another polygonal shape and a circular shape. The shape of a display area DPA of the display device 10 may be similar to the shape of the display device 10. FIG. 1 illustrates the display device 10 having a rectangular shape elongated in a second direction DR2.

The display device 10 may include the display area DPA and a non-display area NDA. The display area DPA may be an area where a screen is displayed, and the non-display area NDA is an area where a screen is not displayed. The display area DPA may be referred to as an active region, and the non-display area NDA may be referred to as a non-active region. The display area DPA may substantially occupy the center area of the display device 10.

The display area DPA may include pixels PX. The pixels PX may be arranged in a matrix. The shape of each pixel PX may be a rectangular or square shape in a plan view.

However, embodiments are not limited thereto, and each pixel PX may be a rhombic shape in which each side thereof is inclined with respect to a direction. The pixels PX may be arranged in a stripe type or an island type. For example, each of the pixels PX may include one or more light emitting elements that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
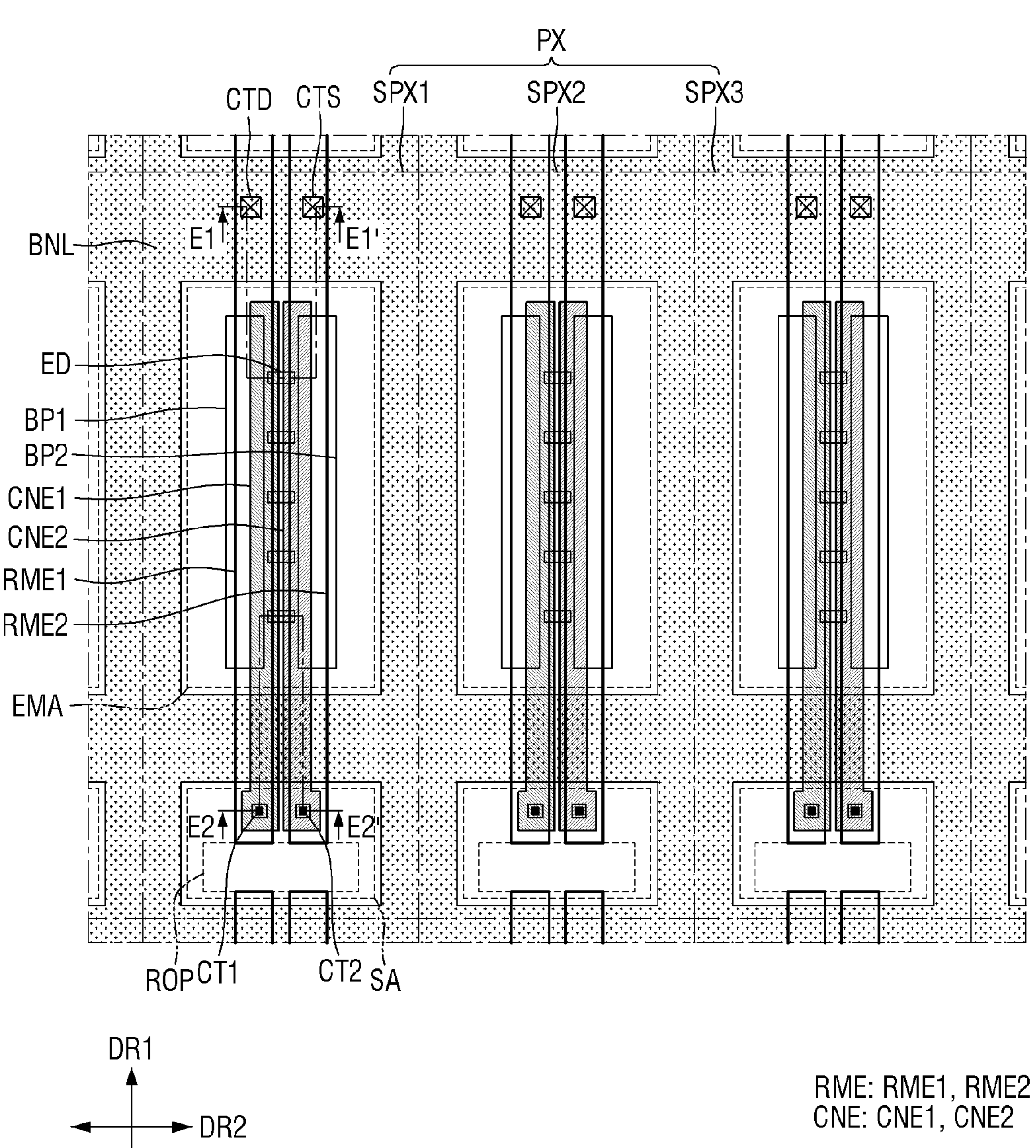
FIG. 2 is a schematic plan view illustrating a pixel of a display device according to an embodiment.

FIG. 2 is a schematic plan view illustrating a pixel of a display device according to an embodiment. FIG. 2 illustrates planar arrangement of electrodes RME (e.g., RME1 and RME2), bank patterns BP1 and BP2, a bank layer BNL, light emitting elements ED, and connection electrodes CNE (e.g., CNE1 and CNE2) disposed in a pixel PX of the display device 10.

Referring to FIG. 2, each of the pixels PX of the display device 10 may include sub-pixels SPXn. For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, embodiments are not limited thereto, and the sub-pixels SPXn may emit light of the same color. In an embodiment, each of the sub-pixels SPXn may emit blue light. Although it is illustrated in the drawing that the pixel PX includes three sub-pixels SPXn, embodiments are not limited thereto, and the pixel PX may include a larger number of sub-pixels SPXn.

Each sub-pixel SPXn of the display device 10 may include an emission area EMA and a non-emission area. The emission area EMA may be an area in which the light emitting element ED emit light of a specific wavelength band. The non-emission area may be a region in which the light emitting element ED is not disposed and a region from which light is not emitted because light emitted from the light emitting element ED does not transmit therethrough.

The emission area EMA may include the region in which the light emitting element ED is disposed, and a region adjacent to the light emitting element ED in which the lights emitted from the light emitting element ED are emitted. For example, the emission area EMA may further include a region in which the light emitted from the light emitting element ED is reflected or refracted by another member and emitted. The light emitting elements ED may be disposed in each sub-pixel SPXn, and the emission area may include an area where the light emitting elements ED are disposed and an area adjacent thereto.

Although it is shown in the drawing that the sub-pixels SPXn have the emission areas EMA that are substantially identical in size, embodiments are not limited thereto. In some embodiments, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA of the corresponding sub-pixel SPXn may be disposed on the lower side of the emission area EMA, which is the other side in the first direction DR1. The emission area EMA and the sub-region SA may be alternately arranged along the first direction DR1, and the sub-region SA may be disposed between the emission areas EMA of different sub-pixels SPXn spaced apart from each other in the first direction DR1. For example, the emission area EMA and the sub-region SA may be alternately arranged in the first direction DR1, and each of the emission area EMA and the sub-region SA may be repeatedly arranged in the second direction DR2. However, embodiments are not limited thereto, and the arrangement of the emission areas EMA and the sub-regions SA in the pixels PX may be different from that shown in FIG. 2.

Light may not be emitted from the sub-region SA because the light emitting element ED is not disposed in the sub-region SA, but an electrode RME disposed in each sub-pixel SPXn may be partially disposed in the sub-region SA. The electrodes RME disposed in different sub-pixels SPXn may be separated at a separation portion ROP of the sub-region SA.

The display device 10 may include the electrodes RME (e.g., RME1 and RME2), the bank patterns BP1 and BP2, the bank layer BNL, the light emitting elements ED, and the connection electrodes CNE (e.g., CNE1 and CNE2).

The bank patterns BP1 and BP2 may be disposed in the emission area EMA of each sub-pixel SPXn. The bank patterns BP1 and BP2 may have a width in the second direction DR2 and may have a shape extending in the first direction DR1.

For example, the bank patterns BP1 and BP2 may include a first bank pattern BP1 and a second bank pattern BP2 spaced apart from each other in the second direction DR2 in the emission area EMA of each sub-pixel SPXn. The first bank pattern BP1 may be disposed on the left side with respect to the center area of the emission area EMA, which is a side in the second direction DR2, and the second bank patterns BP2 may be disposed on the right side with respect to the center area of the emission area EMA, which is another side in the second direction DR2, with being spaced apart from the first bank pattern BP1. The first bank pattern BP1 and the second bank pattern BP2 may be alternately disposed along the second direction DR2 and may be disposed in an island-shaped pattern in the display area DPA. The light emitting elements ED may be arranged between the first bank pattern BP1 and the second bank pattern BP2.

The lengths of the first bank pattern BP1 and the second bank pattern BP2 in the first direction DR1 may be the same, and may be smaller than the length of the emission area EMA surrounded by the bank layer BNL in the first direction DR1. The first bank pattern BP1 and the second bank pattern BP2 may be spaced apart from a portion of the bank layer BNL extending in the second direction DR2. However, embodiments are not limited thereto, and the bank patterns BP1 and BP2 may be integral with the bank layer BNL, or may partially overlap the portion of the bank layer BNL extending in the second direction DR2. For example, the lengths of the bank patterns BP1 and BP2 in the first direction DR1 may be greater than or equal to the length of the emission area EMA surrounded by the bank layer BNL in the first direction DR1.

The widths of the first bank pattern BP1 and the second bank pattern BP2 in the second direction DR2 may be the same. However, embodiments are not limited thereto, and they may have different widths. For example, a bank pattern may have a larger width than another bank pattern, and the bank pattern having a larger width may be disposed across the emission areas EMA of different sub-pixels SPXn adjacent in the second direction DR2. For example, in the bank pattern disposed across the emission areas EMA, a portion of the bank layer BNL extending in the first direction DR1 may overlap the second bank pattern BP2 in the thickness direction of the substrate SUB. Although it is illustrated in the drawing that two bank patterns BP1 and BP2 having the same width are arranged for each sub-pixel SPXn, embodiments are not limited thereto. The number and the shape of the bank patterns BP1 and BP2 may vary according to the number or the arrangement structure of the electrodes RME.

The electrodes RME (e.g., RME1 and RME2) may have a shape extending in a direction and may be disposed for each sub-pixel SPXn. The electrodes RME1 and RME2 may extend in the first direction DR1 to be disposed across the emission area EMA of the sub-pixel SPXn and the sub-region SA, and may be spaced apart from each other in the second direction DR2. The electrodes RME may be connected (e.g., electrically connected) to the light emitting elements ED to be described below. However, embodiments are not limited thereto, and the electrodes RME may not be connected (e.g., electrically connected) to the light emitting element ED.

The display device 10 may include the first electrode RME1 and the second electrode RME2 arranged in each sub-pixel SPXn. The first electrode RME1 may be positioned on the left side with respect to the center area of the emission area EMA, and the second electrode RME2 may be positioned on the right side with respect to the center area of the emission area EMA with being spaced apart from the first electrode RME1 in the second direction DR2. A first electrode RME1 may be disposed on the first bank pattern BP1, and a second electrode RME2 may be disposed on the second bank pattern BP2. The first electrode RME1 and the second electrode RME2 may be arranged (e.g., partially arranged) in the corresponding sub-pixel SPXn and the sub-region SA over the bank layer BNL. The first electrode RME1 and the second electrode RME2 of different sub-pixels SPXn may be separated from each other with respect to the separation portion ROP positioned in the sub-region SA of one sub-pixel SPXn.

Although it is illustrated in the drawing that two electrodes RME have a shape extending in the first direction DR1 for each sub-pixel SPXn, embodiments are not limited thereto. For example, the display device 10 may have a shape in which a larger number of electrodes RME are disposed in one sub-pixel SPXn or the electrodes RME are bent (e.g., partially bent) and have different widths according to positions.

The bank layer BNL may surround the sub-pixels SPXn, the emission area EMA, and the sub-region SA. The bank layer BNL may be disposed at the boundary between the sub-pixels SPXn adjacent in the first direction DR1 and the second direction DR2, and may be disposed at the boundary between the emission area EMA and the sub-region SA. The sub-pixels SPXn, the emission area EMA, and the sub-region SA of the display device 10 may be distinguished from each other by the arrangement of the bank layer BNL. The gaps between the sub-pixels SPXn, the emission areas EMA, and the sub-regions SA may vary according to the width of the bank layer BNL.

The bank layer BNL may include portions extending in the first direction DR1 and the second direction DR2, in a plan view, to be arranged in a grid pattern over the surface (e.g., entire surface) of the display area DPA. The bank layer BNL may be disposed along the boundaries between the sub-pixels SPXn to define the boundaries of the neighboring sub-pixels SPXn. The bank layer BNL may be arranged to surround the emission area EMA and the sub-region SA disposed for each sub-pixel SPXn to define the boundary of each sub-pixel SPXn.

The light emitting elements ED may be arranged in the emission area EMA. The light emitting elements ED may be disposed between the bank patterns BP1 and BP2, and may be arranged to be spaced apart from each other in the first direction DR1. In an embodiment, the light emitting elements ED may have a shape extending in a direction, and ends (e.g., opposite ends) of the light emitting elements ED may be disposed on different electrodes RME. The length of the light emitting element ED may be greater than the gap between the electrodes RME spaced apart from each other in the second direction DR2. The extension direction of the light emitting elements ED may be substantially perpendicular to the first direction DR1 in which the electrodes RME extend. However, embodiments are not limited thereto, and the light emitting element ED may extend in the second direction DR2 or in a direction oblique to the second direction DR2.

The connection electrodes CNE (e.g., CNE1 and CNE2) may be disposed on the electrodes RME and the bank patterns BP1 and BP2. The connection electrodes CNE may have a shape extending in a direction, and may be spaced apart from each other. Each of the connection electrodes CNE may be in contact with the light emitting element ED, and may be connected (e.g., electrically connected) to the electrode RME or the conductive layer disposed thereunder.

The connection electrodes CNE may include the first connection electrode CNE1 and the second connection electrode CNE2 disposed in each sub-pixel SPXn. The first connection electrode CNE1 may have a shape extending in the first direction DR1 and may be disposed on the first electrode RME1 or the first bank pattern BP1. The first connection electrode CNE1 may overlap (e.g., partially overlap) the first electrode RME1 and may be disposed across the emission area EMA and the sub-region SA over the bank layer BNL. The second connection electrode CNE2 may have a shape extending in the first direction DR1 and may be disposed on the second electrode RME2 or the second bank pattern BP2. The second connection electrode CNE2 may overlap (e.g., partially overlap) the second electrode RME2 and may be disposed across the emission area EMA and the sub-region SA over the bank layer BNL.

Figure 3:
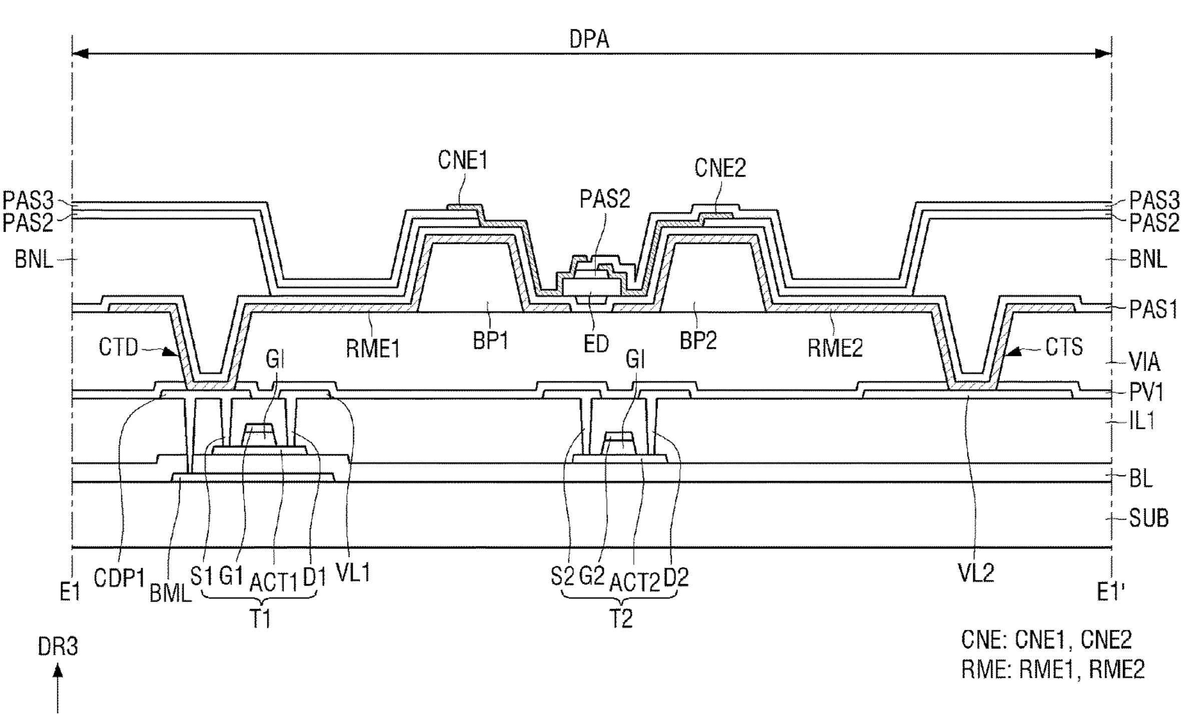
FIG. 3 is a schematic cross-sectional view taken along line E1-E1' of FIG. 2.
Figure 4:
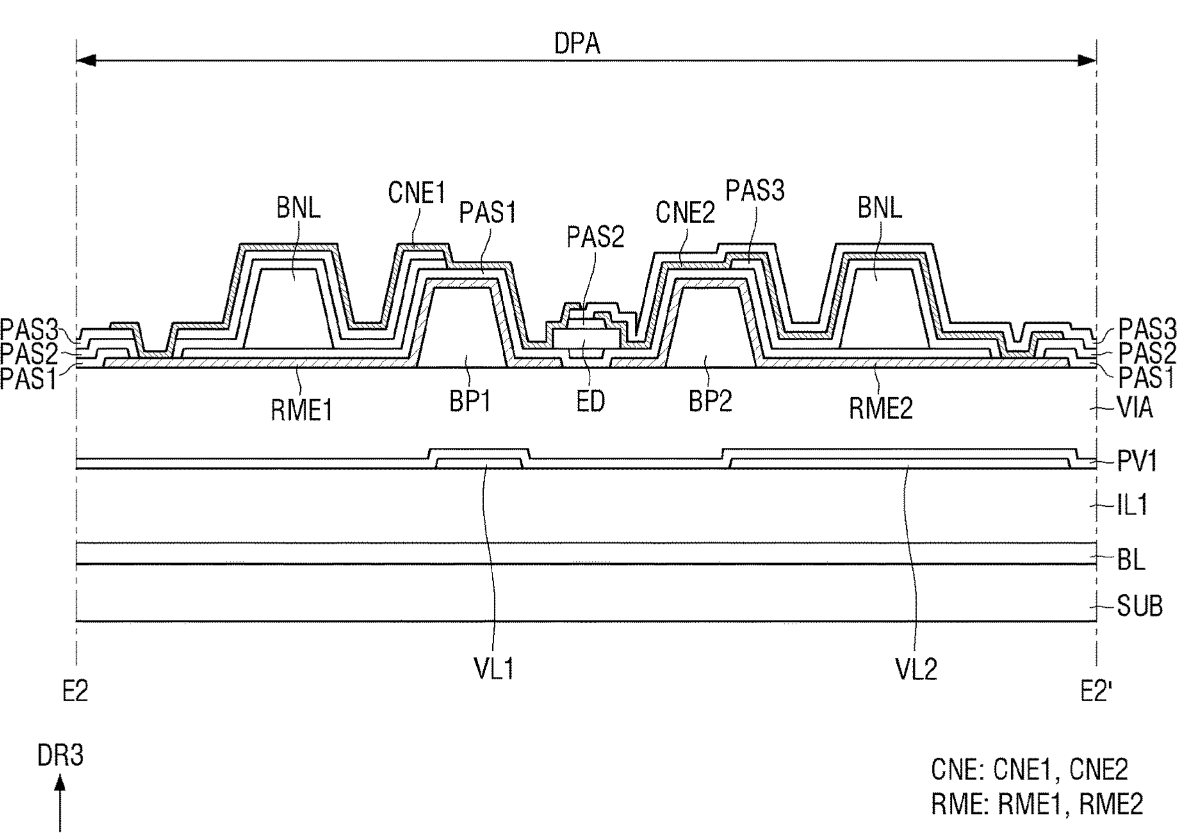
FIG. 4 is a schematic cross-sectional view taken along line E2-E2' of FIG. 2.

FIG. 3 is a schematic cross-sectional view taken along line E1-E1' of FIG. 2. FIG. 4 is a schematic cross-sectional view taken along line E2-E2' of FIG. 2. FIG. 3 illustrates a cross section across ends (e.g., opposite ends) of the light emitting element ED and electrode contact holes CTD and CTS disposed in the first sub-pixel SPX1, and FIG. 4 illustrates a cross section across ends (e.g., opposite ends) of the light emitting element ED and contact portions CT1 and CT2 disposed in the first sub-pixel SPX1.

Referring to FIGS. 2, 3, and 4 to describe the cross-sectional structure of the display device 10, the display device 10 may include a substrate SUB, a semiconductor layer, conductive layers, and insulating layers disposed thereon. For example, the display device 10 may include the electrodes RME (e.g., RME1 and RME2), the light emitting element ED, and the connection electrodes CNE (e.g., CNE1 and CNE2). Each of the semiconductor layer, the conductive layers, and the insulating layers may constitute a circuit layer CCL (see FIG. 6) of the display device 10.

The substrate SUB may be an insulating substrate. The substrate SUB may be made of an insulating material such as glass, quartz, or polymer resin. Further, the substrate SUB may be a rigid substrate. In another example, the substrate SUB may be a flexible substrate which is bendable, foldable, or rollable. The substrate SUB may include the display area DPA and the non-display area NDA surrounding the display area DPA, and the display area DPA may include the emission area EMA and the sub-region SA. For example, the sub-region SA may be a part of the non-emission area.

A first conductive layer may be disposed on the substrate SUB. The first conductive layer may include a lower metal layer BML that overlaps a first active layer ACT1 of a first transistor T1. The lower metal layer BML may prevent light from entering the first active layer ACT1 of the first transistor T1, or may be connected (e.g., electrically connected) to the first active layer ACT1 to stabilize electrical characteristics of the first transistor T1. In another example, the lower metal layer BML may be omitted.

The buffer layer BL may be disposed on the lower metal layer BML and the substrate SUB. The buffer layer BL may be formed on the substrate SUB to protect the transistors of the pixel PX from moisture permeating through the substrate SUB susceptible to moisture permeation, and may perform a surface planarization function.

The semiconductor layer may be disposed on the buffer layer BL. The semiconductor layer may include the first active layer ACT1 of the first transistor T1 and a second active layer ACT2 of the second transistor T2. The first active layer ACT1 and the second active layer ACT2 may overlap (e.g., partially overlap) a first gate electrode G1 and a second gate electrode G2 of a second conductive layer to be described below, respectively.

The semiconductor layer may include polycrystalline silicon, monocrystalline silicon, oxide semiconductor, and the like. In another example, the semiconductor layer may include polycrystalline silicon. The oxide semiconductor may be an oxide semiconductor including indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although it is illustrated in the drawing that the first transistor T1 and the second transistor T2 are disposed in the sub-pixel SPXn of the display device 10, embodiments are not limited thereto and the display device 10 may include a larger number of transistors.

A first gate insulating layer GI may be disposed on the semiconductor layer in the display area DPA. The first gate insulating layer GI may function as a gate insulating layer of each of the transistors T1 and T2. Although it is illustrated in the drawing that the first gate insulating layer GI is patterned together with the gate electrodes G1 and G2 of the second conductive layer to be described below and disposed (e.g., partially disposed) between the second conductive layer and the active layers ACT1 and ACT2 of the semiconductor layer. However, embodiments are not limited thereto. In some embodiments, the first gate insulating layer GI may be disposed (e.g., entirely disposed) on the buffer layer BL.

The second conductive layer may be disposed on the first gate insulating layer GI. The second conductive layer may include a first gate electrode G1 of the first transistor T1 and a second gate electrode G2 of the second transistor T2. The first gate electrode G1 may overlap the channel region of the first active layer ACT1 in a third direction DR3 (e.g., a thickness direction of the substrate SUB), and the second gate electrode G2 may overlap the channel region of the second active layer ACT2 in the third direction DR3 (e.g., the thickness direction of the substrate SUB).

A first interlayer insulating layer IL1 may be disposed on the second conductive layer. The first interlayer insulating layer IL1 may function as an insulating film between the second conductive layer and other layers disposed thereon, and may protect the second conductive layer.

A third conductive layer may be disposed on the first interlayer insulating layer IL1. The third conductive layer may include the first voltage line VL1 and the second voltage line VL2, a first conductive pattern CDP1, a first source electrode S1 and a first drain electrode D1 of the first transistor T1, and a second source electrode S2 and a second drain electrode D2 of the second transistor T2 that are disposed in the display area DPA.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. The first voltage line VL1 may be partially in contact with the first active layer ACT1 of the first transistor T1 through a contact hole that penetrates the first interlayer insulating layer IL1. The first voltage line VL1 may function as a first drain electrode D1 of the first transistor T1. The second voltage line VL2 may be connected (e.g., directly connected) to the second electrode RME2 to be described below.

The first conductive pattern CDP1 may be in contact with the first active layer ACT1 of the first transistor T1 through the contact hole penetrating the first interlayer insulating layer IL1. The first conductive pattern CDP1 may be in contact with the lower metal layer BML, through another contact hole penetrating the first interlayer insulating layer IL1 and the buffer layer BL. The first conductive pattern CDP1 may function as a first source electrode S1 of the first transistor T1. Further, the first conductive pattern CDP1 may be connected to the first electrode RME1 or the first connection electrode CNE1 to be described below. The first transistor T1 may transmit the first power voltage applied from the first voltage line VL1 to the first electrode RME1 or the first connection electrode CNE1.

The second source electrode S2 and the second drain electrode D2 may be in contact with the second active layer ACT2 of the second transistor T2 through the contact holes penetrating the first interlayer insulating layer IL1.

A first passivation layer PV1 may be disposed on the third conductive layer. The first passivation layer PV1 may function as an insulating layer between the third conductive layer and other layers and may protect the third conductive layer.

The buffer layer BL, the first gate insulating layer GI, the first interlayer insulating layer IL1, and the first passivation layer PV1 described above may be formed of inorganic layers stacked in an alternating manner. For example, the buffer layer BL, the first gate insulating layer GI, the first interlayer insulating layer IL1 and the first passivation layer PV1 may be formed as a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, embodiments are not limited thereto, and the buffer layer BL, the first gate insulating layer GI, the first interlayer insulating layer IL1, and the first passivation layer PV1 may be formed as a single inorganic layer including the above-described insulating material. Further, in some embodiments, the first interlayer insulating layer IL1 may be made of an organic insulating material such as polyimide (PI) or the like.

A via layer VIA may be disposed on the third conductive layer in the display area DPA. The via layer VIA may include an organic insulating material, e.g., polyimide (PI), and may compensate the stepped portion formed by the third conductive layer disposed thereunder to provide a flat top surface. However, in some embodiments, the via layer VIA may be omitted.

The display device 10 may include, as a display element layer disposed on the via layer VIA, the bank patterns BP1 and BP2, the electrodes RME (e.g., RME1 and RME2), the bank layer BNL, the light emitting elements ED, and the connection electrodes CNE (e.g., CNE1 and CNE2). For example, the display device 10 may include the insulating layers PAS1, PAS2, and PAS3 disposed on the via layer VIA.

The bank patterns BP1 and BP2 may be disposed on the via layer VIA. For example, each of the bank patterns BP1 and BP2 may be disposed (e.g., directly disposed) on the via layer VIA, and may have a structure in which at least a part thereof protrudes from the top surface of the via layer VIA. The protruding parts of the bank patterns BP1 and BP2 may have an inclined surface or a curved surface with a certain curvature, and the light emitted from the light emitting element ED may be reflected by the electrode RME disposed on the bank patterns BP1 and BP2 and emitted in the upward direction of the via layer VIA. In another example, the bank patterns BP1 and BP2 may have a shape, e.g., a semicircular or semi-elliptical shape, in which the outer surface is curved with a certain curvature in a cross-sectional view. The bank patterns BP1 and BP2 may include an organic insulating material such as polyimide (PI), but embodiments are not limited thereto.

The electrodes RME (e.g., RME1 and RME2) may be disposed on the bank patterns BP1 and BP2 and the via layer VIA. For example, the first electrode RME1 and the second electrode RME2 may be arranged on the inclined surfaces of the bank patterns BP1 and BP2. The widths of the electrodes RME measured in the second direction DR2 may be smaller than the widths of the bank patterns BP1 and BP2 measured in the second direction DR2, and the gap between the first electrode RME1 and the second electrode RME2 in the second direction DR2 may be smaller than the gap between the bank patterns BP1 and BP2. At least a part of the first electrode RME1 and the second electrode RME2 may be arranged (e.g., directly arranged) on the via layer VIA, so that the first electrode RME1 and the second electrode RME2 may be arranged on the same plane.

The light emitting element ED disposed between the bank patterns BP1 and BP2 may emit light toward ends (e.g., opposite ends) of the light emitting element ED, and the emitted light may be directed toward the electrodes RME disposed on the bank patterns BP1 and BP2. The electrodes RME may have a structure including portions thereof disposed on the bank patterns BP1 and BP2. Thus, the electrodes RME may reflect the light emitted from the light emitting element ED. The first electrode RME1 and the second electrode RME2 may be arranged to cover at least one side surfaces of the bank patterns BP1 and BP2 and may reflect the light emitted from the light emitting element ED.

The electrodes RME may be in contact with (e.g., in direct contact with) the third conductive layer through the electrode contact holes CTD and CTS at the portions overlapping the bank layer BNL between the emission area EMA and the sub-region SA. The first electrode contact hole CTD may be formed in an area in which the bank layer BNL and the first electrode RME1 overlap, and the second electrode contact hole CTS may be formed in an area in which the bank layer BNL and the second electrode RME2 overlap. The first electrode RME1 may be in contact with the first conductive pattern CDP1 through the first electrode contact hole CTD penetrating the via layer VIA and the first passivation layer PV1. The second electrode RME2 may be in contact with the second voltage line VL2 through the second electrode contact hole CTS penetrating the via layer VIA and the first passivation layer PV1. The first electrode RME1 may be connected (e.g., electrically connected) to the first transistor T1 through the first conductive pattern CDP1. Thus, the first power voltage may be applied to the first electrode RME1, and the second electrode RME2 may be connected (e.g., electrically connected) to the second voltage line VL2 such that the second power voltage may be applied to the second electrode RME2. However, embodiments are not limited thereto. In another example, the electrodes RME1 and RME2 may not be connected (e.g., electrically connected) to the voltage lines VL1 and VL2 of the third conductive layer, respectively, and the connection electrode CNE to be described below may be connected (e.g., directly connected) to the third conductive layer.

The electrodes RME may include a conductive material having high reflectivity. For example, the electrodes RME may include a metal such as silver (Ag), copper (Cu), or aluminum (Al), or may include an alloy including aluminum (Al), nickel (Ni), lanthanum (La), or the like. In another example, the electrodes RME may have a structure in which a metal layer such as titanium (Ti), molybdenum (Mo), and niobium (Nb) and the alloy are stacked. In some embodiments, the electrodes RME may be formed as a double layer or a multilayer formed by stacking at least one metal layer made of an alloy including aluminum (Al) and titanium (Ti), molybdenum (Mo), and niobium (Nb).

Embodiments are not limited thereto, and each electrode RME may further include a transparent conductive material. For example, each electrode RME may include a material such as ITO, IZO, and ITZO. In some embodiments, each of the electrodes RME may have a structure in which at least one transparent conductive material and at least one metal layer having high reflectivity are stacked, or may be formed as a single layer including them. For example, each electrode RME may have a stacked structure of ITO/Ag/ITO, ITO/Ag/IZO, ITO/Ag/ITZO/IZO, or the like. The electrodes RME may be connected (e.g., electrically connected) to the light emitting element ED, and may reflect some of the lights emitted from the light emitting element ED in an upward direction of the substrate SUB.

The first insulating layer PAS1 may be disposed in the entire display area DPA and may be disposed on the via layer VIA and the electrodes RME. The first insulating layer PAS1 may include an insulating material to protect the electrodes RME and insulate electrodes RME different from each other. The first insulating layer PAS1 may cover the electrodes RME before the bank layer BNL is formed, so that it is possible to prevent the electrodes RME from being damaged in a process of forming the bank layer BNL. For example, the first insulating layer PAS1 may prevent the light emitting element ED disposed thereon from being damaged by direct contact with other members.

In an embodiment, the first insulating layer PAS1 may have stepped portions such that the top surface of the first insulating layer PAS1 may be recessed (e.g., partially depressed) between the electrodes RME spaced apart in the second direction DR2. The light emitting element ED may be disposed on the top surface of the first insulating layer PAS1, where the stepped portions are formed, and thus a space may remain between the light emitting element ED and the first insulating layer PAS1.

The first insulating layer PAS1 may include the contact portions CT1 and CT2 disposed in the sub-region SA. The contact portions CT1 and CT2 may overlap different electrodes RME, respectively. For example, the contact portions CT1 and CT2 may include first contact portions CT1 overlapping the first electrode RME1 and second contact portions CT2 overlapping the second electrode RME2. The first contact portions CT1 and the second contact portions CT2 may penetrate the first insulating layer PAS1 to exposed (e.g., partially expose) the top surface of the first electrode RME1 or the second electrode RME2 thereunder. Each of the first contact portion CT1 and the second contact portion CT2 may further penetrate some of the other insulating layers disposed on the first insulating layer PAS1. The electrode RME exposed by each of the contact portions CT1 and CT2 may be in contact with the connection electrode CNE.

The bank layer BNL may be disposed on the first insulating layer PAS1. The bank layer BNL may include portions extending in the first direction DR1 and the second direction DR2, and may surround the sub-pixels SPXn. The bank layer BNL may surround and distinguish the emission area EMA and the sub-region SA of each sub-pixel SPXn, and may surround the outermost part of the display area DPA and distinguish the display area DPA and the non-display area NDA.

Similarly to the bank patterns BP1 and BP2, the bank layer BNL may have a certain height. In some embodiments, the top surface of the bank layer BNL may be higher than that of the bank patterns BP1 and BP2, and the thickness of the bank layer BNL may be equal to or greater than that of the bank patterns BP1 and BP2. The bank layer BNL may prevent ink from overflowing to adjacent sub-pixels SPXn in an inkjet printing process during the manufacturing process of the display device 10. Similarly to the bank patterns BP1 and BP2, the bank layer BNL may include an organic insulating material such as polyimide (PI).

The light emitting elements ED may be arranged in the emission area EMA. The light emitting elements ED may be disposed on the first insulating layer PAS1 between the bank patterns BP1 and BP2. The light emitting element ED may be disposed such that a direction, in which the light emitting element ED extends, may be parallel to the top surface of the substrate SUB. As will be described below, the light emitting element ED may include semiconductor layers arranged along a direction in which the light emitting element ED extends, and the semiconductor layers may be sequentially arranged along the direction parallel to the top surface of the substrate SUB. However, embodiments are not limited thereto, and the semiconductor layers may be arranged in the direction perpendicular to the substrate SUB in case that the light emitting element ED has another structure.

The light emitting elements ED disposed in each sub-pixel SPXn may emit light of different wavelength bands according to a material constituting the semiconductor layer. However, embodiments are not limited thereto, and the light emitting elements ED arranged in each sub-pixel SPXn may include the semiconductor layer of the same material and emit light of the same color.

The light emitting elements ED may be connected (e.g., electrically connected) to the electrode RME and the conductive layers below the via layer VIA with being in contact with the connection electrodes CNE (e.g., CNE1 and CNE2), and may emit light of a specific wavelength band by receiving an electrical signal.

The second insulating layer PAS2 may be disposed on the light emitting elements ED, the first insulating layer PAS1, and the bank layer BNL. The second insulating layer PAS2 may include a pattern portion disposed on the light emitting elements ED and extending in the first direction DR1 between the bank patterns BP1 and BP2. The pattern portion may surround (e.g., partially surround) the outer surface of the light emitting element ED, and may not cover sides (e.g., opposite sides) or ends (e.g., opposite ends) of the light emitting element ED. The pattern portion may be formed in a linear or island-like pattern in each sub-pixel SPXn in a plan view. The pattern portion of the second insulating layer PAS2 may protect the light emitting element ED and fix the light emitting elements ED during a manufacturing process of the display device 10. Further, the second insulating layer PAS2 may fill the space between the light emitting element ED and the first insulating layer PAS1 thereunder. Further, a part of the second insulating layer PAS2 may be disposed on the bank layer BNL and in the sub-regions SA.

The second insulating layer PAS2 may include the contact portions CT1 and CT2 disposed in the sub-region SA. The second insulating layer PAS2 may include the first contact portion CT1 overlapping the first electrode RME1, and the second contact portion CT2 overlapping the second electrode RME2. The contact portions CT1 and CT2 may penetrate the second insulating layer PAS2 in addition to the first insulating layer PAS1. The first contact portions CT1 and the second contact portions CT2 may expose (e.g., partially expose) the top surface of the first electrode RME1 or the second electrode RME2 disposed thereunder.

The connection electrodes CNE (e.g., CNE1 and CNE2) may be disposed on the electrodes RME and the bank patterns BP1 and BP2. The first connection electrode CNE1 may be disposed on the first electrode RME1 and the first bank pattern BP1. The first connection electrode CNE1 may overlap (e.g., partially overlap) the first electrode RME1 and may be disposed across the emission area EMA and the sub-region SA over the bank layer BNL. The second connection electrode CNE2 may be disposed on the second electrode RME2 and the second bank pattern BP2. The second connection electrode CNE2 may overlap (e.g., partially overlap) the second electrode RME2 and may be disposed across the emission area EMA and the sub-region SA over the bank layer BNL.

Each of the first connection electrode CNE1 and the second connection electrode CNE2 may be disposed on the second insulating layer PAS2 and may be in contact with the light emitting elements ED. The first connection electrode CNE1 may overlap (e.g., partially overlap) the first electrode RME1 and may be in contact with an end of each of the light emitting elements ED. The second connection electrode CNE2 may overlap (e.g., partially overlap) the second electrode RME2 and may be in contact with another end of each of the light emitting elements ED. The connection electrodes CNE may be disposed across the emission area EMA and the sub-region SA. The connection electrodes CNE may be in contact with the light emitting elements ED at portions disposed in the emission area EMA, and may be connected (e.g., electrically connected) to the third conductive layer at portions disposed in the sub-region SA. The first connection electrode CNE1 may be in contact with a first end of the light emitting element ED, and the second connection electrode CNE2 may be in contact with a second end of the light emitting element ED.

In accordance with an embodiment, in the display device 10, the connection electrodes CNE may be in contact with the electrode RME through the contact portions CT1 and CT2 disposed in the sub-region SA. The first connection electrode CNE1 may be in contract with the first electrode RME1 through the first contact portion CT1 penetrating the first insulating layer PAS1, the second insulating layer PAS2, and the third insulating layer PAS3 in the sub-region SA. The second connection electrode CNE2 may be in contact with the second electrode RME2 through the second contact portion CT2 penetrating the first insulating layer PAS1 and the second insulating layer PAS2 in the sub-region SA. Each of the connection electrodes CNE may be connected (e.g., electrically connected) to the third conductive layer through each of electrodes RME. The first connection electrode CNE1 may be connected (e.g., electrically connected) to the first transistor T1, so that the first power voltage may be applied to the first connection electrode CNE1, and the second connection electrode CNE2 may be connected (e.g., electrically connected) to the second voltage line VL2, so that the second power voltage may be applied to the second connection electrode CNE2. Each connection electrode CNE may be in contact the light emitting element ED in the emission area EMA to transmit the power voltage to the light emitting element ED.

However, embodiments are not limited thereto. In some embodiments, the connection electrodes CNE may be in contact with (e.g., in direct contact with) the third conductive layer, and may be connected (e.g., electrically connected) to the third conductive layer through patterns other than the electrodes RME.

The connection electrodes CNE may include a conductive material. For example, they may include ITO, IZO, ITZO, aluminum (Al), or the like. As an example, the connection electrodes CNE may include a transparent conductive material, and light emitted from the light emitting element ED may pass through the connection electrodes CNE to be emitted.

The third insulating layer PAS3 may be disposed on the second connection electrode CNE2 and the second insulating layer PAS2 of the first connection electrode layer. The third insulating layer PAS3 may be disposed on the entire second insulating layer PAS2 to cover the second connection electrode CNE2, and the first connection electrode CNE1 of the second connection electrode layer may be disposed on the third insulating layer PAS3. The third insulating layer PAS3 may insulate the first connection electrode CNE1 and the second connection electrode CNE2 to prevent direct contact therebetween.

The third insulating layer PAS3 may include the first contact portions CT1 disposed in the sub-region SA. The first contact portion CT1 may penetrate the third insulating layer PAS3 in addition to the first insulating layer PAS1 and the second insulating layer PAS2. The first contact portions CT1 may expose (e.g., partially expose) the top surface of the first electrode RME1 disposed thereunder.

For example, another insulating layer ('PAS4' in FIG. 6) may be further disposed on the third insulating layer PAS3 and the first connection electrode CNE1. The insulating layer may function to protect the members disposed on the substrate SUB against the external environment.

Each of the first insulating layer PAS1, the second insulating layer PAS2 and the third insulating layer PAS3 described above may include an inorganic insulating material or an organic insulating material. For example, each of the first insulating layer PAS1, the second insulating layer PAS2, and the third insulating layer PAS3 may include an inorganic insulating material. In another example, the first insulating layer PAS1 and the third insulating layer PAS3 may include an inorganic insulating material. For example, the second insulating layer PAS2 may include an organic insulating material. Each or at least one of the first insulating layer PAS1, the second insulating layer PAS2, and the third insulating layer PAS3 may have a structure in which insulating layers are stacked each other alternately or repeatedly. In an embodiment, each of the first insulating layer PAS1, the second insulating layer PAS2, and the third insulating layer PAS3 may be any one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material or different materials. In another example, some of them may be made of the same material and some of them may be made of different materials.

Figure 5:
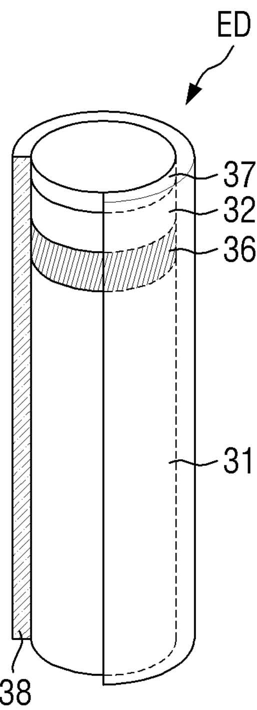
FIG. 5 is a schematic diagram of a light emitting element according to an embodiment.

FIG. 5 is a schematic diagram of a light emitting element according to an embodiment.

Referring to FIG. 5, the light emitting element ED may be a light emitting diode. For example, the light emitting element ED may be an inorganic light emitting diode. The inorganic light emitting diode may have a nanometer or micrometer size, and may be made of an inorganic material. The light emitting element ED may be aligned between two electrodes having polarity in case that an electric field is formed in a specific direction between two electrodes facing each other.

The light emitting element ED according to an embodiment may have a shape elongated in a direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in a direction and having an outer surface inclined (e.g. partially inclined).

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Sn, or the like.

The second semiconductor layer 32 may be disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like.

Although it is illustrated in the drawing that the first semiconductor layer 31 and the second semiconductor layer 32 are formed as a layer, embodiments are not limited thereto. According to the material of the light emitting layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be one or more of AlGaInN, GaN, AlGaN, InGaN, AlN, InN and SLs doped with an n-type dopant, and the semiconductor layer disposed between the second semiconductor layer 32 and the light emitting layer 36 may be one or more of AlGaInN, GaN, AlGaN, InGaN, AlN and InN doped with a p-type dopant.

The light emitting layer 36 may be disposed between the first semiconductor layer 31 and the second semiconductor layer 32. The light emitting layer 36 may include a material having a single quantum well structure or a multiple quantum well structure. In case that the light emitting layer 36 includes a material having a multiple quantum well structure, quantum layers and well layers may be stacked alternately. The light emitting layer 36 may emit light by coupling of electron-hole pairs according to an electrical signal applied through the first semiconductor layer 31 and the second semiconductor layer 32. The light emitting layer 36 may include a material such as AlGaN, AlGaInN, or InGaN. In case that the light emitting layer 36 has a multiple quantum well structure in which quantum layers and well layers are alternately stacked, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy are alternately stacked, and may include other group III to V semiconductor materials according to the wavelength band of the emitted light. The light emitted by the light emitting layer 36 is not limited to the light of the blue wavelength band, but the light emitting layer 36 may emit light of a red wavelength band or a green wavelength band in some cases.

The electrode layer 37 may be an ohmic connection electrode. However, embodiments are not limited thereto, and it may be a Schottky connection electrode. The light emitting element ED may include at least one electrode layer 37. The light emitting element ED may include one or more electrode layers 37, but embodiments are not limited thereto. In another example, the electrode layer 37 may be omitted.

In the display device 10, in case that the light emitting element ED is connected (e.g., electrically connected) to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 may be arranged to surround the outer surfaces of the semiconductor layers and electrode layers described above. For example, the insulating film 38 may surround at least the outer surface of the light emitting layer 36, and may expose ends (e.g., opposite ends) of the light emitting element ED in the longitudinal direction. Further, in a cross-sectional view, the insulating film 38 may have a top surface, which is rounded in a region adjacent to at least one end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). It is illustrated in the drawing that the insulating film 38 is formed as a single layer, but embodiments are not limited thereto. In some embodiments, the insulating film 38 may be formed in a multilayer structure having layers stacked therein.

The insulating film 38 may perform a function of protecting the semiconductor layers and the electrode layer of the light emitting element ED. The insulating film 38 may prevent an electrical short circuit that may occur at the light emitting layer 36 in case that an electrode to which an electrical signal is transmitted is in direct contact with the light emitting element ED. For example, the insulating film 38 may prevent a decrease in luminous efficiency of the light emitting element ED.

Further, the insulating film 38 may have an outer surface which is surface-treated. The light emitting elements ED may be aligned in such a way of spraying the ink in which the light emitting elements ED are dispersed on the electrodes. For example, the surface of the insulating film 38 may be treated to have a hydrophobic property or hydrophilic property in order to keep the light emitting elements ED in the dispersed state without being aggregated with other adjacent light emitting elements ED in the ink.

According to an embodiment, the display device 10 may further include color control members TPL, WCL1, and WCL2 (see FIG. 6) and color filter layers CFL1, CFL2, and CFL3 (see FIG. 6) disposed above the light emitting elements ED. Light emitted from the light emitting element ED may be emitted through the color control members TPL, WCL1, and WCL2 and the color filter layers CFL1, CFL2, and CFL3, and in case that the same type of light emitting elements ED are disposed in each sub-pixel SPXn, the color of the emitted light may be different for each sub-pixel SPXn.

Figure 6:
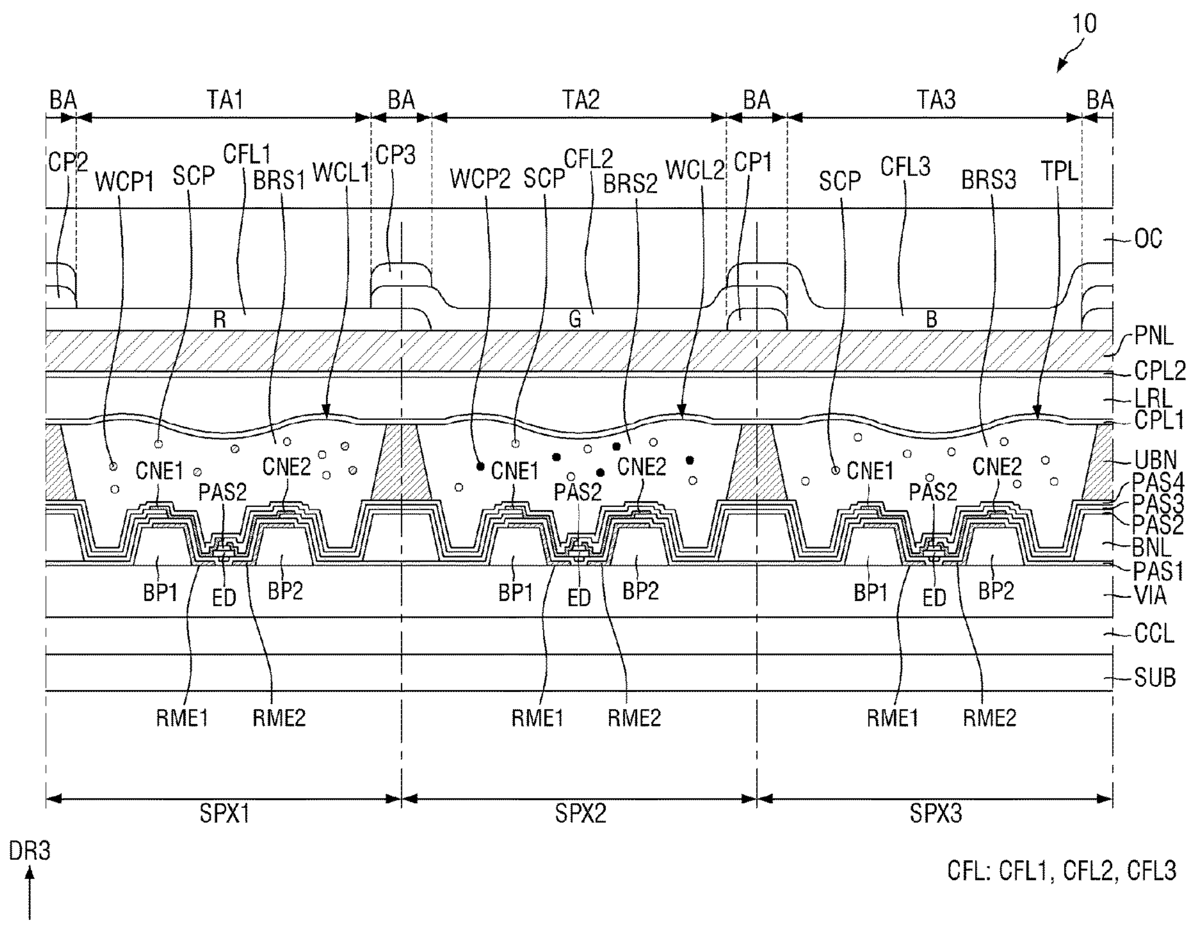
FIG. 6 is a schematic cross-sectional view of a display device according to an embodiment.

FIG. 6 is a schematic cross-sectional view of a display device according to an embodiment.

Referring to FIG. 6, the display device 10 may include the light emitting elements ED disposed above the substrate SUB, and the color control members TPL, WCL1, and WCL2 and the color filter layers CFL1, CFL2, and CFL3 disposed above the light emitting elements ED. For example, the display device 10 may further include layers disposed between the color control members TPL, WCL1, and WCL2 and the color filter layers CFL1, CFL2, and CFL3. Hereinafter, the layers disposed on the light emitting elements ED of the display device 10 will be described.

The fourth insulating layer PAS4 may be disposed on the third insulating layer PAS3, the connection electrodes CNE1 and CNE2, and the bank layer BNL. The fourth insulating layer PAS4 may protect the layers disposed on the substrate SUB. In another example, the fourth insulating layer PAS4 may be omitted.

An upper bank layer UBN, the color control members TPL, WCL1, and WCL2, color patterns CP1, CP2, and CP3, and the color filter layers CFL1, CFL2, and CFL3 may be disposed on the fourth insulating layer PAS4. Capping layers CPL1 and CPL2, a low refractive layer LRL, and a planarization layer PNL may be disposed between the color control members TPL, WCL1, and WCL2 and the color filter layers CFL1, CFL2, and CFL3, and the overcoat layer OC may be disposed on the color filter layers CFL1, CFL2, and CFL3.

The display device 10 may include light transmitting areas TA1, TA2, and TA3 in which the color filter layers CFL1, CFL2, and CFL3 are disposed to emit light and a light blocking area BA disposed between the light transmitting areas TA1, TA2 and TA3 and in which light is not emitted. The light transmitting areas TA1, TA2, and TA3 may be positioned to correspond to (or overlap) a part of the emission area EMA of each sub-pixel SPXn, and the light blocking area BA may be an area other than the light transmitting areas TA1, TA2, and TA3.

The upper bank layer UBN may be disposed on the fourth insulating layer PAS4 to overlap the bank layer BNL. The upper bank layer UBN may include portions extending in the first and second directions DR1 and DR2 and may be disposed in a grid pattern. The upper bank layer UBN may surround the emission area EMA or a portion in which the light emitting elements ED are arranged. The upper bank layer UBN may include an area in which the color control members TPL, WCL1, and WCL2 are disposed.

The color control members TPL, WCL1, and WCL2 may be disposed in an area surrounded by the upper bank layer UBN on the fourth insulating layer PAS4. The color control members TPL, WCL1, and WCL2 may be arranged in the light transmitting areas TA1, TA2, and TA3 surrounded by the upper bank layer UBN to form an island-shaped pattern in the display area DPA. However, embodiments are not limited thereto, and the color control members TPL, WCL1, and WCL2 may be arranged over the sub-pixels SPXn and may extend in a direction to form a linear pattern.

In case that the light emitting element ED of each sub-pixel SPXn emits the third color light (e.g., blue light), the color control members TPL, WCL1, and WCL2 may include the first wavelength conversion layer WCL1 disposed in the first sub-pixel SPX1 to correspond to (or overlap) a first light transmitting area TA1, the second wavelength conversion layer WCL2 disposed in the second sub-pixel SPX2 to correspond to (or overlap) a second light transmitting area TA2, and the light transmitting layer TPL disposed in the third sub-pixel SPX3 to correspond to (or overlap) a third light transmitting area TA3.

The first wavelength conversion layer WCL1 may include a first base resin BRS1 and a first wavelength conversion material WCP1 disposed in the first base resin BRS1. The second wavelength conversion layer WCL2 may include a second base resin BRS2 and a second wavelength conversion material WCP2 disposed in the second base resin BRS2. The first wavelength conversion layer WCL1 and the second wavelength conversion layer WCL2 may transmit the third color light (e.g., the blue light) incident from the light emitting element ED with converting the wavelength thereof. The first wavelength conversion layer WCL1 and the second wavelength conversion layer WCL2 may further include a scatterer SCP included in each of the first, second, and third base resins BRS1, BRS2, or BRS3, and the scatterer SCP may increase wavelength conversion efficiency.

The light transmitting layer TPL may include a third base resin BRS3 and the scatterer SCP included in the third base resin BRS3. The light transmitting layer TPL may transmit the third color light (e.g., the blue light) incident from the light emitting element ED with maintaining the wavelength thereof. The scatterer SCP of the light transmitting layer TPL may function to control an emission path of the light emitted through the light transmitting layer TPL. The light transmitting layer TPL may not include a wavelength conversion material.

The scatterer SCP may be a metal oxide particle or an organic particle. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include acrylic resin and urethane resin, and the like.

The first, second, and third base resins BRS1, BRS2, and BRS3 may include a light transmitting organic material. For example, the first, second, and third base resins BRS1, BRS2, and BRS3 may include an epoxy resin, an acrylic resin, a cardo resin, an imide resin, or the like. The first, second, and third base resins BRS1, BRS2 and BRS3 may be formed of the same material, but embodiments are not limited thereto.

The first wavelength conversion material WCP1 may convert a third color light (e.g., blue light) into a first color light (e.g., red light), and the second wavelength conversion material WCP2 may convert a third color light (e.g., blue light) into a second color light (e.g., green light). The first wavelength conversion material WCP1 and the second wavelength conversion material WCP2 may be quantum dots, quantum bars, phosphors or the like. Examples of the quantum dot may include group IV nanocrystal, group II-VI compound nanocrystal, group III-V compound nanocrystal, group IV-VI nanocrystal, and a combination thereof.

In some embodiments, the color control members TPL, WCL1, and WCL2 may be formed by an inkjet printing process or a photoresist process. The color control members TPL, WCL1, and WCL2 may be formed by a process of spraying or coating materials thereof into the area surrounded by the upper bank layer UBN, and then by a process of performing drying or exposure and a development process. For example, in case that the color control members TPL, WCL1, and WCL2 are formed by the inkjet printing process, the top surfaces of the respective layers of the color control members TPL, WCL1, and WCL2 may be curved so that the edge portion adjacent to the upper bank layer UBN may be higher than the central portion in the drawing. However, embodiments are not limited thereto. In an embodiment, the color control members TPL, WCL1, and WCL2 may be formed by the photoresist process, the top surfaces of the respective layers of the color control members TPL, WCL1, and WCL2 may be flat. Thus, the edge portion adjacent to the upper bank layer UBN may be parallel to the top surface of the upper bank layer UBN, or the central portions of the color control members TPL, WCL1, and WCL2 may be higher unlike the drawing.

The light emitting element ED of each sub-pixel SPXn may emit the blue light of the same third color, and the sub-pixels SPXn may emit lights of different colors. For example, the light emitted from the light emitting element ED disposed in the first sub-pixel SPX1 may be incident on the first wavelength conversion layer WCL1. The light emitted from the light emitting element ED disposed in the second sub-pixel SPX2 may be incident on the second wavelength conversion layer WCL2 . The light emitted from the light emitting element ED disposed in the third sub-pixel SPX3 may be incident on the light transmitting layer TPL. The light incident on the first wavelength conversion layer WCL1 may be converted into red light, the light incident on the second wavelength conversion layer WCL2 may be converted into green light, and the light incident on the light transmitting layer TPL may be transmitted as the same blue light without performing wavelength conversion. Although each sub-pixel SPXn includes the light emitting elements ED that emit the light of the same color, the lights of different colors may be emitted according to the arrangement of the color control members TPL, WCL1, and WCL2 arranged thereabove.

The first capping layer CPL1 may be disposed on the color control members TPL, WCL1 and WCL2 and the upper bank layer UBN. The first capping layer CPL1 may prevent impurities such as moisture or air from permeating from the outside and damaging or contaminating the color control members TPL, WCL1, and WCL2. The first capping layer CPL1 may include an inorganic insulating material.

The low refractive layer LRL may be disposed on the first capping layer CPL1. The low refractive layer LRL may be an optical layer for recycling the light having transmitted the color control members TPL, WCL1, and WCL2. Thus, the low refractive layer LRL may improve the light emission efficiency and the color purity of the display device 10. The low refractive layer LRL may be made of an organic material having a low refractive index and may compensate the stepped portions formed by the color control members TPL, WCL1, and WCL2 and the upper bank layer UBN.

The second capping layer CPL2 may be disposed on the low refractive layer LRL, and may prevent impurities such as moisture, air or the like from permeating from the outside and damaging or contaminating the low refractive layer LRL. The second capping layer CPL2 may include an inorganic insulating material similarly to the first capping layer CPL1.

The planarization layer PNL may be disposed across the entire display area DPA and the entire non-display area NDA on the second capping layer CPL2. The planarization layer PNL may overlap the color control members TPL, WCL1, and WCL2 in the display area DPA, and may overlap a dam member DAM (see FIG. 8) and a valley VA (see FIG. 8) to be described below in the non-display area NDA.

The planarization layer PNL may protect the members disposed on the substrate SUB in addition to the capping layers CPL1 and CPL2 and the low refractive layer LRL, and may compensate (e.g. partially compensate) the stepped portion formed by them. For example, the planarization layer PNL may compensate for a height difference formed by the color control members TPL, WCL1, and WCL2, the upper bank layer UBN, and the bank layer BNL below the planarization layer PNL in the display area DPA, so that the color filter layers CFL1, CFL2, and CFL3 disposed on the planarization layer PNL may be formed on a flat surface.

The color filter layers CFL1, CFL2, and CFL3 may be disposed on the planarization layer PNL. The color filter layers CFL1, CFL2, and CFL3 may be disposed in the light transmitting areas TA1, TA2, and TA3, and a part thereof may be disposed in the light blocking area BA. The color filter layers CFL1, CFL2, and CFL3 may overlap the other color filter layers CFL1, CFL2, and CFL3 or the color pattern CP1, CP2, CP3 in the light blocking area BA. A part of the color filter layers CFL1, CFL2, and CFL3 that do not overlap the other color filter layers CFL1, CFL2, and CFL3 may be the light transmitting areas TA1, TA2, and TA3 through which light is transmitted, and a region where the different color filter layers CFL1, CFL2, and CFL3 overlap each other or the color patterns CP1, CP2, and CP3 are disposed may be the light blocking area BA by which light emission is blocked.

The color filter layers CFL1, CFL2, and CFL3 may include a first color filter layer CFL1 disposed in the first sub-pixel SPX1, a second color filter layer CFL2 disposed in the second sub-pixel SPX2, and a third color filter layer CFL3 disposed in the third sub-pixel SPX3. The color filter layers CFL1, CFL2, and CFL3 may be formed in a linear pattern disposed on the light transmitting areas TA1, TA2, and TA3 or the emission areas EMA. However, embodiments are not limited thereto. The color filter layers CFL1, CFL2, and CFL3 may be disposed to correspond to (or overlap) the light transmitting areas TA1, TA2, and TA3, respectively, and may form an island-shaped pattern.

The color filter layers CFL1, CFL2, and CFL3 may include a colorant such as a dye and a pigment that absorb light of a wavelength band other than a specific wavelength band. The color filter layers CFL1, CFL2, and CFL3 may be arranged for each sub-pixel SPXn and may transmit only a part of the light incident on the color filter layers CFL1, CFL2, and CFL3 in the corresponding sub-pixel SPXn. Each sub-pixel SPXn of the display device 10 may selectively display only the light that has passed through the color filter layers CFL1, CFL2, and CFL3. In an embodiment, the first color filter layer CFL1 may be a red color filter layer, the second color filter layer CFL2 may be a green color filter layer, and the third color filter layer CFL3 may be a blue color filter layer. The lights emitted from the light emitting element ED may be emitted through the color filter layers CFL1, CFL2, and CFL3 with transmitting the color control members TPL, WCL1, and WCL2.

The color patterns CP1, CP2, and CP3 may be disposed on the planarization layer PNL or the color filter layers CFL1, CFL2, and CFL3. The color patterns CP1, CP2, and CP3 and the color filter layers CFL1, CFL2, and CFL3 may include the same material. The color patterns CP1, CP2, and CP3 may be disposed in the light blocking area BA. In the light blocking area BA, the color pattern CP1, CP2, CP3 and different color filter layers CFL1, CFL2, and CFL3 may be stacked, and light transmission may be blocked in the stacked region.

The first color pattern CP1 and the first color filter layer CFL1 may be made of the same material. The first color pattern CP1 may be disposed in the light blocking area BA. The first color pattern CP1 may be disposed (e.g., directly disposed) on the planarization layer PNL in the light blocking area BA, and may not be disposed in the light blocking area BA adjacent to the first light transmitting area TA1 of the first sub-pixel SPX1. The first color pattern CP1 may be disposed in the light blocking area BA between the second sub-pixel SPX2 and the third sub-pixel SPX3. The first color filter layer CFL1 may be disposed in the light blocking area BA around the first sub-pixel SPX1.

The second color pattern CP2 and the second color filter layer CFL2 may be made of the same material. The second color pattern CP2 may be disposed in the light blocking area BA. The second color pattern CP2 may be disposed (e.g., directly disposed) on the planarization layer PNL in the light blocking area BA, and may not be disposed in the light blocking area BA adjacent to the second light transmitting area TA2 of the second sub-pixel SPX2. The second color pattern CP2 may be disposed in the light blocking area BA between the first sub-pixel SPX1 and the third sub-pixel SPX3, or on a boundary area between the non-display area NDA and the outermost sub-pixel SPXn of the display area DPA. The second color filter layer CFL2 may be disposed in the light blocking area BA around the second sub-pixel SPX2.

The third color pattern CP3 and the third color filter layer CFL3 and may be made of the same material. The third color pattern CP3 may be disposed in the light blocking area BA. The third color pattern CP3 may be disposed (e.g., directly disposed) on the planarization layer PNL in the light blocking area BA, and may not be disposed in the light blocking area BA adjacent to the third light transmitting area TA3 of the third sub-pixel SPX3. The third color pattern CP3 may be disposed in the light blocking area BA between the first sub-pixel SPX1 and the second sub-pixel SPX2. The third color filter layer CFL3 may be disposed in the light blocking area BA around the third sub-pixel SPX3.

In the display device 10, a region overlapping the bank layer BNL and the upper bank layer UBN may be the light blocking area BA, and each of the first color pattern CP1, the second color pattern CP2, and the third color pattern CP3 may be disposed in the light blocking area BA to overlap at least one of the color filter layers CFL1, CFL2, and CFL3 including different colorants. For example, the first color pattern CP1 may overlap the second color filter layer CFL2 and the third color filter layer CFL3, the second color pattern CP2 may overlap the first color filter layer CFL1 and the third color filter layer CFL3, and the third color pattern CP3 may overlap the first color filter layer CFL1 and the second color filter layer CFL2. In the light blocking area BA, the color filter layers CFL1, CFL2, and CFL3, and the color patterns CP1, CP2, and CP3 including different colorants may overlap each other, thereby blocking light transmission.

The color patterns CP1, CP2, and CP3 may have a stacked structure with the color filter layers CFL1, CFL2, and CFL3, and may prevent color mixing between adjacent areas by the materials including different colorants. Since the color patterns CP1, CP2, and CP3 and the color filter layers CFL1, CFL2, and CFL3 include the same material, reflected light or external light passing through the light blocking area BA may have a wavelength band of a specific color. The eye color sensibility perceived by user's eyes may vary according to the color of the light. For example, the light in the blue wavelength band may be perceived less sensitively to a user than the light in the green wavelength band and the light in the red wavelength band. In the display device 10, since the color patterns CP1, CP2, and CP3 are disposed in the light blocking area BA, the transmission of the light may be blocked and the user may perceive the reflected light relatively less sensitively. Also, it is possible to absorb a part of the light from the outside of the display device 10 and reduce the reflected light due to the external light.

The overcoat layer OC may be disposed on the color filter layers CFL1, CFL2, and CFL3 and the color patterns CP1, CP2, and CP3. The overcoat layer OC may be disposed in the entire display area DPA, and may be disposed (e.g., partially disposed) in the non-display area NDA. The overcoat layer OC may protect the members including an organic insulating material and arranged in the display area DPA from the outside.

The display device 10 according to an embodiment may include the color control members TPL, WCL1, and WCL2 and the color filter layers CFL1, CFL2, and CFL3 disposed on the light emitting elements ED, so that lights of different colors may be displayed in case that the same type of light emitting elements ED are disposed in each sub-pixel SPXn.

For example, the light emitting element ED disposed in the first sub-pixel SPX1 may emit the third color light (e.g., the blue light), and the light may be incident on the first wavelength conversion layer WCL1 with transmitting the fourth insulating layer PAS4. The first base resin BRS1 of the first wavelength conversion layer WCL1 may be made of a transparent material, and a part of the light may transmit the first base resin BRS1 and be incident on the first capping layer CPL1 disposed thereon. However, at least a part of the light may be incident on the scatterer SCP and the first wavelength conversion material WCP1 arranged in the first base resin BRS1. The light may be scattered and subjected to wavelength conversion, and may be incident as red light on the first capping layer CPL1. The lights incident on the first capping layer CPL1 may be incident on the first color filter layer CFL1 with transmitting the low refractive layer LRL, the second capping layer CPL2, and the planarization layer PNL, and the transmission of other lights except the red light may be blocked by the first color filter layer CFL1. Accordingly, the first sub-pixel SPX1 may emit the red light.

The lights emitted from the light emitting element ED disposed in the second sub-pixel SPX2 may be emitted as the green light with transmitting the fourth insulating layer PAS4, the second wavelength conversion layer WCL2, the first capping layer CPL1, the low refractive layer LRL, the second capping layer CPL2, the planarization layer PNL, and the second color filter layer CFL2.

The light emitting element ED disposed in the third sub-pixel SPX3 may emit the third color light (e.g., the blue light), and the blue light may be incident on the light transmitting layer with transmitting the fourth insulating layer PAS4. The third base resin BRS3 of the light transmitting layer TPL may be made of a transparent material, and a part of the light may transmit the third base resin BRS3 and be incident on the first capping layer CPL1 disposed thereon. The lights incident on the first capping layer CPL1 may be incident on the third color filter layer CFL3 with transmitting the low refractive layer LRL, the second capping layer CPL2, and the planarization layer PNL, and the transmission of other lights except the blue light may be blocked by the third color filter layer CFL3. Accordingly, the third sub-pixel SPX3 may emit the blue light.

Figure 7:
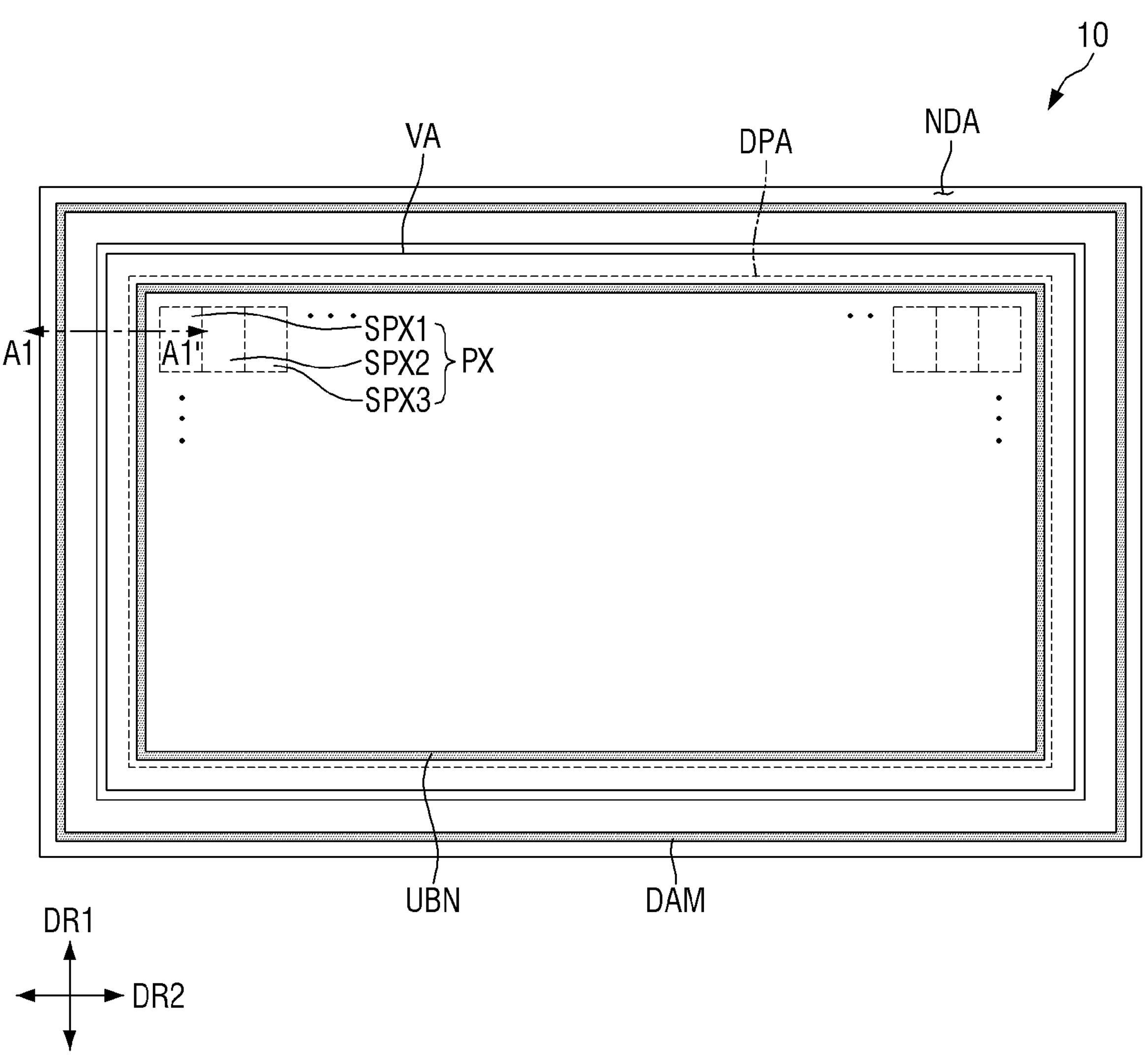
FIG. 7 is a schematic diagram illustrating a dam member and a valley disposed in a display area and a non-display area in a display device according to an embodiment.
Figure 8:
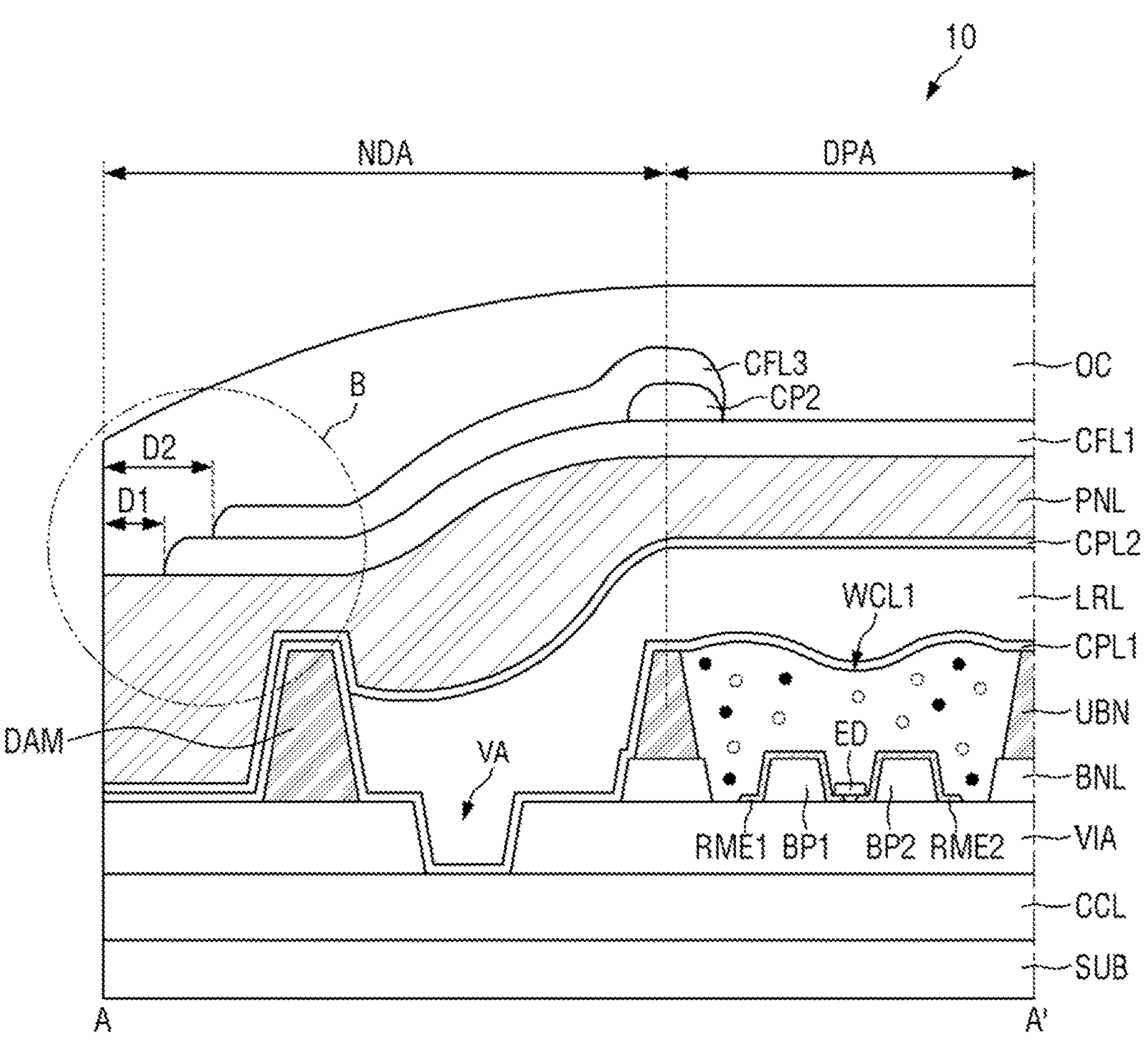
FIG. 8 is a schematic cross-sectional view taken along line A1-A1' of FIG. 7.

FIG. 7 is a schematic diagram illustrating a dam member and a valley disposed in a display area and a non-display area in a display device according to an embodiment. FIG. 8 is a schematic cross-sectional view taken along line A1-A1' of FIG. 7.

FIG. 8 illustrates a cross section of a part of the display area DPA and the non-display area NDA taken in the second direction DR2 in the outer part of the display device 10. FIG. 8 illustrates a left outer part that is a side in the second direction DR2 in the outer part of the display device 10. In FIG. 8, the conductive layers and the semiconductor layer of the display area DPA are simply illustrated as the circuit layer CCL, and only the bank patterns BP1 and BP2, the electrodes RME1 and RME2, and the light emitting element ED are illustrated by simplifying the electrodes RME, the light emitting elements ED, the connection electrodes CNE, the insulating layers PAS1, PAS2, and PAS3, and the like disposed in each of the sub-pixels SPXn. A description of these structures is substantially the same as described above with reference to FIGS. 2, 3, and 4.

Referring to FIGS. 7 and 8 in conjunction with FIG. 6, the display device 10 may include the upper bank layer UBN and the bank layer BNL including a portion disposed in the outer part of the display area DPA, and the valley VA and the dam member DAM disposed in the non-display area NDA to surround the display area DPA.

The upper bank layer UBN and the bank layer BNL may extend in the first direction DR1 and the second direction DR2 in the display area DPA. As described above, the upper bank layer UBN may be disposed on the bank layer BNL. For example, the upper bank layer UBN and the bank layer BNL may be disposed in the same pattern shape in a plan view. For example, the upper bank layer UBN and the bank layer BNL may be disposed in the outer part of the display area DPA to surround a portion in which the pixels PX are disposed FIG. 7 illustrates only a part of the upper bank layer UBN and the bank layer BNL disposed in the outermost part of the display area DPA, but embodiments are not limited thereto. For example, the upper bank layer UBN and the bank layer BNL may extend in the first direction DR1 or the second direction DR2 with traversing the display area DPA, and may be disposed on a boundary area between the sub-pixels SPXn. The upper bank layer UBN and the bank layer BNL may distinguish (or define) the display area DPA from the non-display area NDA, and may distinguish (or define) different sub-pixels SPXn.

The dam member DAM may be disposed in the non-display area NDA to surround the display area DPA. The dam member DAM may be spaced apart from the upper bank layer UBN and the bank layer BNL. The dam member DAM may be spaced apart from the upper bank layer UBN and the bank layer BNL by a distance. The display area DPA may be disposed inside a region surrounded by the dam member DAM.

The display device 10 may have a structure in which layers are sequentially stacked on a substrate SUB. Some of the layers of the display device 10 may be made of an organic material, and may be formed by a process of injecting (e.g., directly injecting) the organic material onto the substrate SUB. Since the organic material flows with fluidity, the organic material injected onto the display area DPA may overflow to the non-display area NDA. The dam member DAM may prevent the organic material from overflowing beyond the non-display area NDA to the outside of the dam member DAM.

The display device 10 according to an embodiment may include the valley VA disposed in the non-display area NDA between the dam member DAM, and the upper bank layer UBN and the bank layer BNL. The dam member DAM, the upper bank layer UBN, and the bank layer BNL may have a shape protruding upward from the via layer VIA. For example, the valley VA may be formed by recessing a part of the via layer VIA. The valley VA may form an engraved and embossed pattern together with the dam member DAM, the upper bank layer UBN, and the bank layer BNL to prevent the organic material sprayed onto the display area DPA from overflowing to the non-display area NDA.

As the encapsulation structure disposed on the color control members WCL1, WCL2, and TPL, the first capping layer CPL1 and the second capping layer CPL2 may extend to the non-display area NDA. A part of the first capping layer CPL1 may be disposed (e.g., directly disposed) on the fourth insulating layer PAS4 shown in FIG. 6, and another part of the first capping layer CPL1 may be disposed (e.g., directly disposed) on the upper bank layer UBN, the dam member DAM, and the valley VA. The first capping layer CPL1 may be disposed along stepped portions formed by the color control members WCL1, WCL2, and TPL, the upper bank layer UBN, the dam member DAM, and the valley VA.

The second capping layer CPL2 may be disposed on the first capping layer CPL1. The low refractive layer LRL may be disposed between the first capping layer CPL1 and the second capping layer CPL2. The low refractive layer LRL may not extend in the entire non-display area NDA unlike in the display area DPA, so that a part of the second capping layer CPL2 may be disposed (e.g., directly disposed) on the first capping layer CPL1.

The low refractive layer LRL may be made of an organic material and may be disposed in the entire display area DPA. In the process of coating the organic material on the first capping layer CPL1, the organic material may overflow to the non-display area NDA over the upper bank layer UBN positioned at the outermost part of the display area DPA. For example, in the display device 10, a substrate SUB may be disposed and layers may be formed thereon through consecutive processes. In the processes, the organic material which has overflowed to an undesired region of the non-display area NDA may remain as a foreign material in the subsequent process. The display device 10 according to an embodiment may include the embossed and intaglio pattern-shaped structures arranged in the non-display area NDA, so that it is possible to prevent the organic material overflowed to the non-display area NDA from further spreading to an undesired region.

The display device 10 may include the valley VA and the dam member DAM disposed in the non-display area NDA to form a structure having an engraved pattern and/or an embossed pattern with respect to the top surface of the via layer VIA. The valley VA may have an engraved pattern shape recessed toward the bottom surface of the via layer VIA with respect to the top surface of the via layer VIA, and the dam member DAM may have an embossed pattern shape protruding upward with respect to the top surface of the via layer VIA.

The valley VA may be spaced apart from the upper bank layer UBN with surrounding the display area DPA in a plan view. The valley VA may have a width and may pass through the via layer VIA. Some layers disposed on the via layer VIA may be disposed in the valley VA. For example, the first capping layer CPL1 disposed on the color control members WCL1, WCL2, and TPL may be disposed (e.g., partially disposed) in the valley VA. The first capping layer CPL1 may include an inorganic insulating material, and may be disposed along a stepped portion formed by the valley VA in the via layer VIA. Since the inorganic insulating material such as the first capping layer CPL1 may be disposed in the valley VA, external moisture may be prevented from penetrating or permeating into the circuit layer CCL exposed by the valley VA.

The low refractive layer LRL may be disposed on the first capping layer CPL1 and may be disposed (e.g., partially disposed) in the non-display area NDA over the upper bank layer UBN. The low refractive layer LRL may be disposed on the valley VA, and a part of the low refractive layer LRL may fill the stepped portion formed by the valley VA. In a process of forming the low refractive layer LRL, the organic material forming the low refractive layer LRL may flow to the non-display area NDA beyond the display area DPA to fill the stepped portion formed by the valley VA, and the valley VA and the dam member DAM may prevent the organic material from overflowing excessively. The low refractive layer LRL may be disposed up to the dam member DAM with filling the valley VA.

The dam member DAM may be spaced apart from the valley VA with surrounding the valley VA. The valley VA and the dam member DAM may be sequentially spaced apart from the upper bank layer UBN along a direction toward the outside of the non-display area NDA. Since the dam member DAM has an embossed pattern shape that protrudes upward from the via layer VIA, the low refractive layer LRL may be prevented from overflowing to the outside of the non-display area NDA.

The valley VA may be disposed closer to the display area DPA than the dam member DAM, and may be a primary structure that prevents the overflow of the low refractive layer LRL. The valley VA may have a width larger than that of the dam member DAM in order to maximally prevent the overflow of the organic material of the low refractive layer LRL. The dam member DAM may have an embossed pattern shape with a width smaller than that of the valley VA, so that the organic material may be prevented from overflowing to the outermost part of the non-display area NDA beyond the valley VA. However, embodiments are not limited thereto, and the widths of the dam member DAM and the valley VA may be the same.

The dam member DAM and the upper bank layer UBN may be formed in the same process. The upper bank layer UBN may be disposed on the bank layer BNL to overlap the bank layer BNL, and may be disposed in a grid pattern in the inside of the display area DPA with surrounding the inside at the outermost part of the display area DPA. In a process of forming the upper bank layer UBN, the dam member DAM may be formed in the non-display area NDA. However, according to an embodiment, the width of the upper bank layer UBN may be equal to or smaller than the width of the dam member DAM in a cross-sectional view. The upper bank layer UBN may form the space where color control members TPL, WCL1, and WCL2 are arranged, and may distinguish (or define) adjacent sub-pixels SPXn in the display area DPA. The dam member DAM may be for preventing the overflow of the low refractive layer LRL, and the purpose of the dam member DAM may be different from that of the upper bank layer UBN. The upper bank layer UBN and the dam member DAM may include the same material and be formed in the same process, but the widths of the upper bank layer UBN and the dam member DAM may be different according to their functions.

The planarization layer PNL may be disposed in the display area DPA and the non-display area NDA on the second capping layer CPL2. In the display area DPA, the planarization layer PNL may cover the color control members WCL1, WCL2, and TPL to planarize stepped portions caused by the color control members WCL1, WCL2, and TPL. For example, in the non-display area NDA, the planarization layer PNL may be disposed beyond the dam member DAM to the outside of the dam member DAM to planarize a stepped portion caused by the dam member DAM.

The low refractive layer LRL may be disposed to the inside of the dam member DAM, but may not be disposed to the outside of the dam member DAM. Accordingly, in cast that the planarization layer PNL is disposed, a stepped portion, which is not filled with the planarization layer PNL, may be formed between the inside and the outside of the dam member DAM or between the display area DPA and the non-display area NDA. For example, since the color filter layers CFL1, CFL2, and CFL3 and the color patterns CP1, CP2, and CP3 are disposed on the planarization layer PNL in the display area DPA, in cast that a height difference between the display area DPA and the non-display area NDA is large, a void (or an empty space) may be formed under an optical film AR (see FIG. 12) disposed on the overcoat layer OC in the non-display area NDA.

To prevent the void under the optical film AR, in the display device 10 according to an embodiment, only one dam member DAM may be disposed in the non-display area NDA, and some of the color filter layers CFL1, CFL2, and CFL3 disposed in the outermost sub-pixels SPXn of the display area DPA may extend to the non-display area NDA.

The dam member DAM may be disposed to prevent the overflow of the low refractive layer LRL disposed in the display area DPA, and in case that dam members DAM are disposed, a large height difference may occur according to the location of the non-display area NDA. In case that a large height difference occurs in a region between a portion above the dam member DAM and the dam member DAM, the planarization layer PNL may not compensate the height difference. The display device 10 may include only one dam member DAM surrounding the display area DPA in the non-display area NDA to minimize a height difference formed in the non-display area NDA.

At least two of different types of color filter layers CFL1, CFL2, and CFL3 may be disposed to overlap each other in the non-display area NDA. For example, as shown in FIG. 8, in case that the outermost sub-pixel SPXn of the display area DPA is the first sub-pixel SPX1 where the first wavelength conversion layer WCL1 is disposed, the first color filter layer CFL1 disposed in the first sub-pixel SPX1 may extend to the non-display area NDA to the outer side of the dam member DAM. The second color pattern CP2 may be disposed on the first color filter layer CFL1 on a boundary area between the display area DPA and the non-display area NDA, and the third color filter layer CFL3 may be disposed on the second color pattern CP2. The third color filter layer CFL3 may extend to the non-display area NDA and may be disposed on the first color filter layer CFL1.

Since the dam member DAM and the valley VA disposed in the non-display area NDA form an embossed pattern and/or an engraved pattern, a height difference in the non-display area NDA may be greater than that in the display area DPA. For example, since the non-display area NDA does not include the color control members WCL1, WCL2, and TPL and the low refractive layer LRL disposed therein unlike the display area DPA, the height in the non-display area NDA may be relatively lower than that in the display area DPA. The display device 10 may include the color filter layers CFL1, CFL2, and CFL3 extending to the non-display area NDA, thereby reducing a height difference between the display area DPA and the non-display area NDA. In an embodiment, a part of the non-display area NDA, in which the color filter layers CFL1 and CFL3 are stacked, may have a height of about 5 μm to about 10 μm, for example, about 9 μm. However, embodiments are not limited thereto.

The drawing illustrates the case where the first sub-pixel SPX1 is the outermost sub-pixel, so that the first color filter layer CFL1 and the third color filter layer CFL3 may be disposed in the non-display area NDA. However, embodiments are not limited thereto. In case that the outermost sub-pixel is another sub-pixel (e.g., the second sub-pixel SPX2 or the third sub-pixel SPX3), the second color filter layer CFL2 may extend to the non-display area NDA.

However, in case that the outermost sub-pixel is the second sub-pixel SPX2 or the third sub-pixel SPX3, the first color filter layer CFL1 and the third color filter layer CFL3 integral with the first color pattern CP1 or the third color pattern CP3 may extend to the non-display area NDA. As the color filter layers CFL1, CFL2, and CFL3 of different colorants overlap each other in the non-display area NDA, it is possible to prevent light from being emitted to the non-display area NDA or the non-display area NDA from being viewed from the outside. In case that the first color filter layer CFL1 including a red colorant and the third color filter layer CFL3 including a blue colorant overlap each other, the light transmission effect may be relatively large.

The overcoat layer OC may cover the color filter layers CFL1, CFL2, and CFL3 in the display area DPA, and may cover the dam member DAM, the color filter layers CFL1, CFL2, and CFL3, and the planarization layer PNL in the non-display area NDA. The overcoat layer OC may be disposed on the color filter layers CFL1 and CFL3 extending to the non-display area NDA so as not to have a large height difference between the display area DPA and the non-display area NDA.

The display device 10 may have a shape in which the height of the top surface of the overcoat layer OC gradually decreases (or is gradually lowered) from the display area DPA to the outermost part of the non-display area NDA. In case that some of the color filter layers CFL1, CFL2, and CFL3 are extended to be disposed in the non-display area NDA, there may be a limitation in planarizing the top surface of the overcoat layer OC by completely removing the height difference between the display area DPA and the non-display area NDA. The display device 10 may have an arrangement structure in which the outermost part of the display device 10 is not higher than the central part of the non-display area NDA by the color filter layers CFL1, CFL2, and CFL3 and the planarization layer PNL disposed in the outermost part. For example, the first color filter layer CFL1 and the third color filter layer CFL3 extending to the non-display area NDA may be disposed so as not to completely overlap each other in the outermost part of the display device 10.

Figure 9:
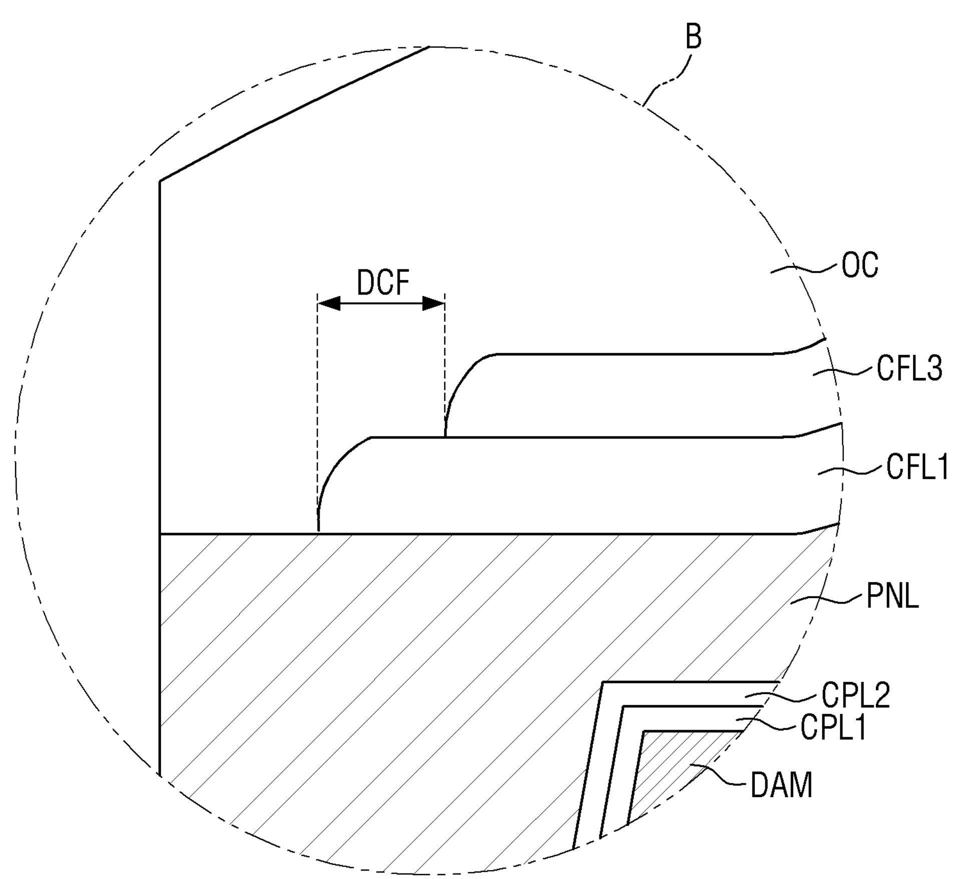
FIG. 9 is a schematic enlarged view of part B of FIG. 8.

FIG. 9 is a schematic enlarged view of part B of FIG. 8.

Referring to FIG. 9, the outer edges of the first color filter layer CFL1 and the third color filter layer CFL3 disposed in the non-display area NDA may not overlap each other. The third color filter layer CFL3 may be disposed on the first color filter layer CFL1 in the non-display area NDA, and the outermost edge of the first color filter layer CFL1 and the outermost edge of the third color filter layer CFL3 may be spaced apart from each other by a distance DCF (e.g., in a plan view). The first color filter layer CFL1 may not be disposed on the outermost edge of the planarization layer PNL or the outermost edge of the display device 10, but may be spaced apart therefrom inward by a distance. A separation distance from the outermost edge of the display device 10 to the outer edge of the first color filter layer CFL1 may be smaller than a separation distance from the outermost edge of the display device 10 to the outer edge of the third color filter layer CFL3. Referring to FIG. 8, a distance D1 between the outermost edge of the non-display area NDA and the outermost edge of the first color filter layer CFL1 may be smaller than a distance D2 between the outermost edge of the non-display area NDA and the outermost edge of the third color filter layer CFL3 (e.g., in a plan view).

In the outermost part of the display device 10, since the planarization layer PNL, the first color filter layer CFL1, and the third color filter layer CFL3 may have edges spaced apart from each other without completely overlapping each other, the height of the top surface in the non-display area NDA may decrease (or be lowered) as being closer toward the outermost edge of the display device 10. The overcoat layer OC disposed on the color filter layers CFL1, CFL2, and CFL3 and the planarization layer PNL may have a shape in which the height gradually decreases (or is gradually lowered) as moving from the display area DPA to the non-display area NDA, and the height of the top surface thereof may not increase again at the outermost edge of the display device 10.

Figure 10:
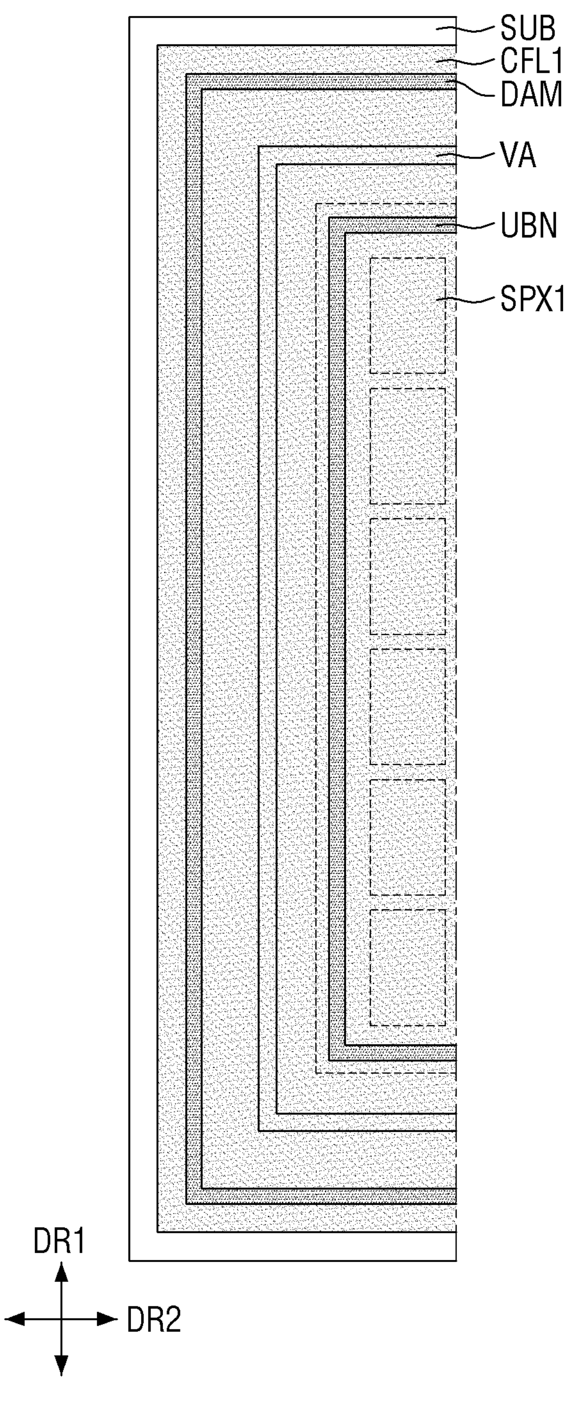
FIG. 10 is a schematic plan view illustrating an arrangement of a first color filter layer disposed in a display area and a non-display area of a display device according to an embodiment.
Figure 11:
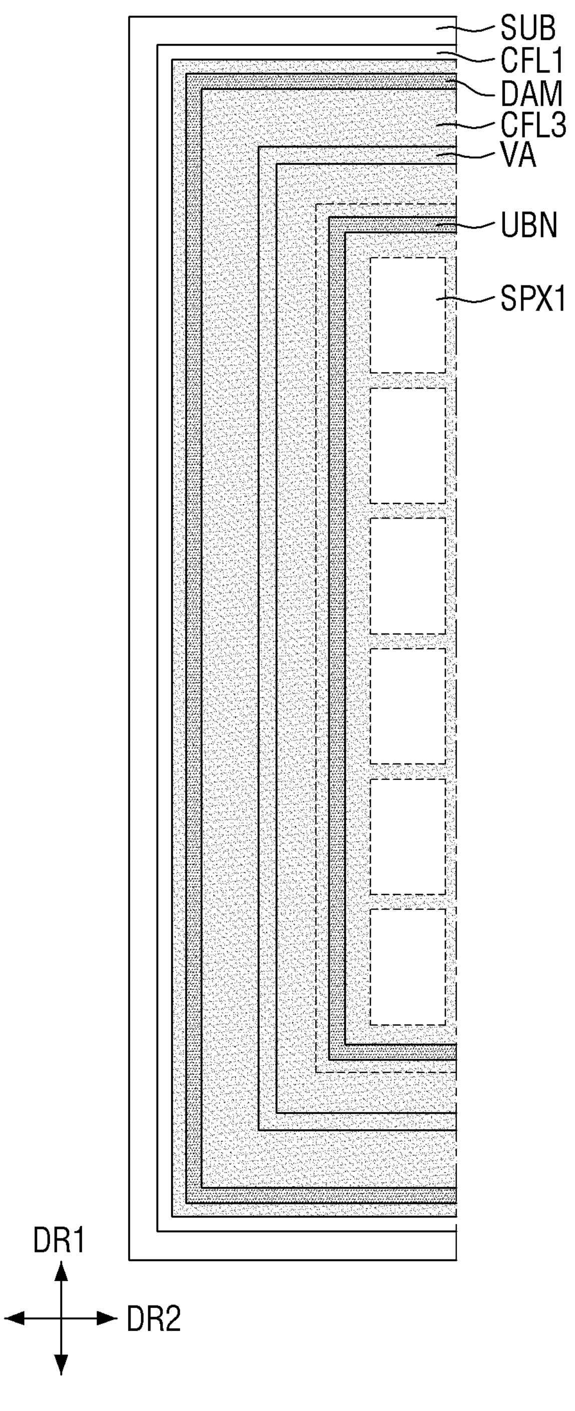
FIG. 11 is a schematic plan view illustrating an arrangement of a third color filter layer disposed in the display area and the non-display area of FIG. 10.

FIG. 10 is a schematic plan view illustrating an arrangement of a first color filter layer disposed in a display area and a non-display area of a display device according to an embodiment. FIG. 11 is a schematic plan view illustrating an arrangement of a third color filter layer disposed in the display area and the non-display area of FIG. 10.

Referring to FIGS. 10 and 11 in conjunction with FIG. 9, in case that the outermost sub-pixel is the first sub-pixel SPX1, the first color filter layer CFL1 in the outermost sub-pixel may be disposed on the first sub-pixels SPX1, and may extend therefrom to the non-display area NDA beyond the dam member DAM. In the display area DPA, the first color filter layer CFL1 may be disposed in the light transmitting area of the first sub-pixel SPX1 and even in the light blocking area around the light transmitting area. The first color filter layer CFL1 extending therefrom in the first direction DR1 and the second direction DR2 may be disposed up to the outermost part of the non-display area NDA beyond the upper bank layer UBN, the valley VA, and the dam member DAM. However, the first color filter layer CFL1 may be spaced apart inward from the outermost edge of the non-display area NDA or the outermost edge of the display device 10.

The third color filter layer CFL3 disposed in the outermost sub-pixel may be disposed in the light blocking area BA around the light transmitting area of the first sub-pixel SPX1, and may extend therefrom to the non-display area NDA beyond the dam member DAM. In the display area DPA, the third color filter layer CFL3 may be disposed so as not to overlap the light transmitting area of the first sub-pixel SPX1, and may be disposed as the third color pattern CP3 in the light blocking area around the light transmitting area. The third color filter layer CFL3 extending in the first direction DR1 and the second direction DR2 from the outer part of the outermost sub-pixel SPXn may be disposed up to the outermost part of the non-display area NDA beyond the upper bank layer UBN, the valley VA, and the dam member DAM. However, the third color filter layer CFL3 may be spaced apart inward from the outermost edge of the first color filter layer CFL1.

The first color filter layer CFL1 and the third color filter layer CFL3 may overlap each other in the non-display area NDA, and may extend to the outside of the dam member DAM. Each of the first color filter layer CFL1 and the third color filter layer CFL3 may overlap the dam member DAM and the valley VA in the non-display area NDA, but the outermost edges of the first and third color filter layers CFL1 and CFL3 may not overlap each other. The outermost edge of the third color filter layer CFL3 may be disposed between the outermost edge of the first color filter layer CFL1 and the dam member (e.g., in a plan view).

Figure 12:
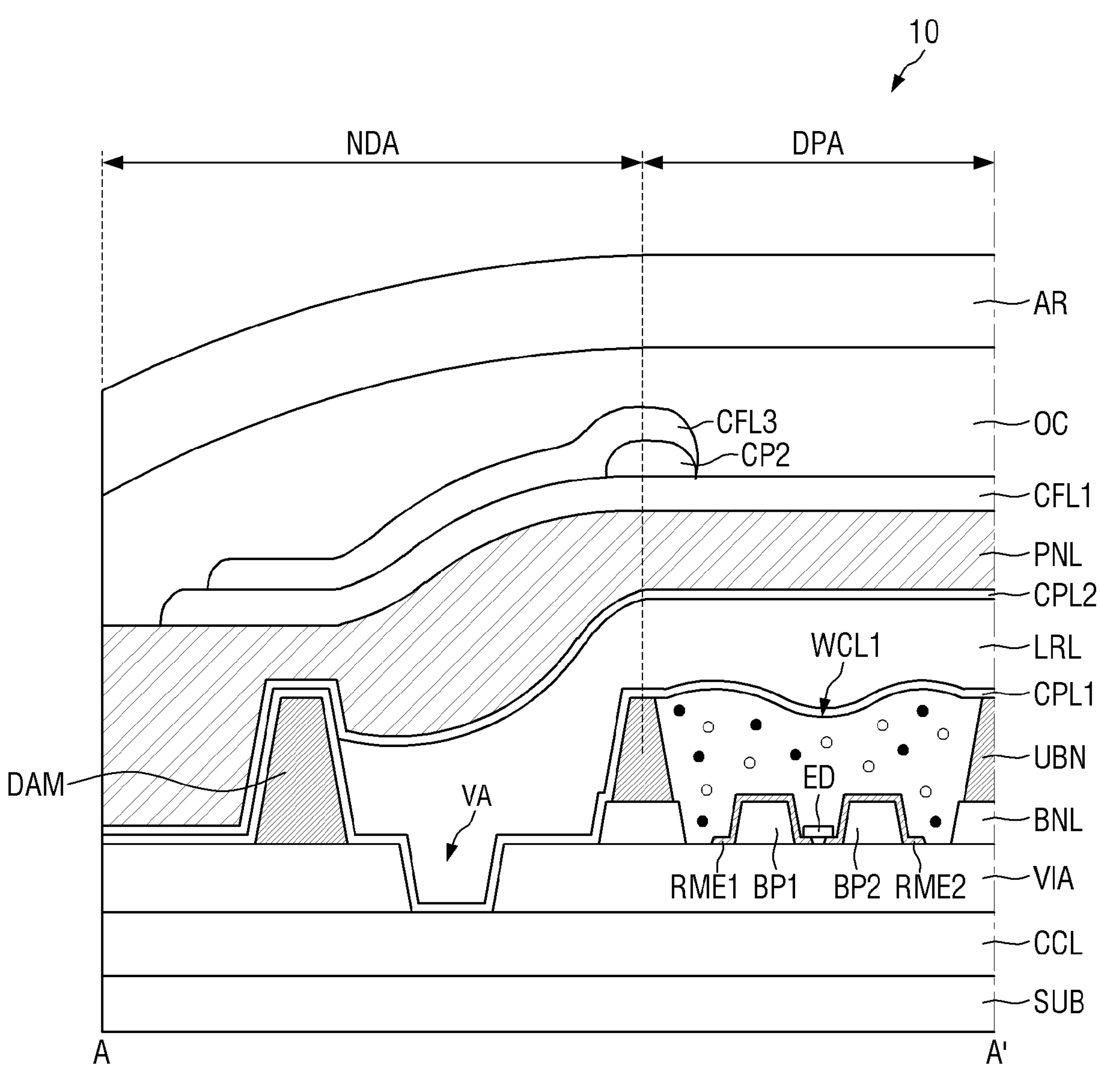
FIG. 12 is a schematic cross-sectional view of a display device on which an optical film is disposed, according to an embodiment.

FIG. 12 is a schematic cross-sectional view of a display device on which an optical film is disposed, according to an embodiment.

Referring to FIG. 12, the display device 10 may include the optical film AR disposed on the overcoat layer OC. The optical film AR may function to prevent visibility deterioration caused by reflection of external light. The optical film AR may include a retardation film and a coating layer for protecting the film. The optical film AR may include a layer made of a cellulose resin such as triacetyl cellulose, a polyester resin, or the like, but embodiments are not limited thereto.

In case that the overcoat layer OC, the color filter layers CFL1, CFL2, and CFL3, and the planarization layer PNL are made of a flexible material including an organic material, the optical film AR may include a relatively hard material. The display device 10 may include the color filter layers CFL1 and CFL3 extending to the non-display area NDA, thereby having a small height difference between the display area DPA and the non-display area NDA. As the top surface of the overcoat layer OC has a shape that is gradually lowered as moving from the display area DPA to the non-display area NDA, it is possible to prevent a void from being formed between the overcoat layer OC and the optical film AR in the non-display area NDA. Accordingly, the display device 10 may prevent an appearance defect that may occur in case that the optical film AR is attached.

Hereinafter, other embodiments of the display device 10 will be described with reference to other drawings.

Figure 13:
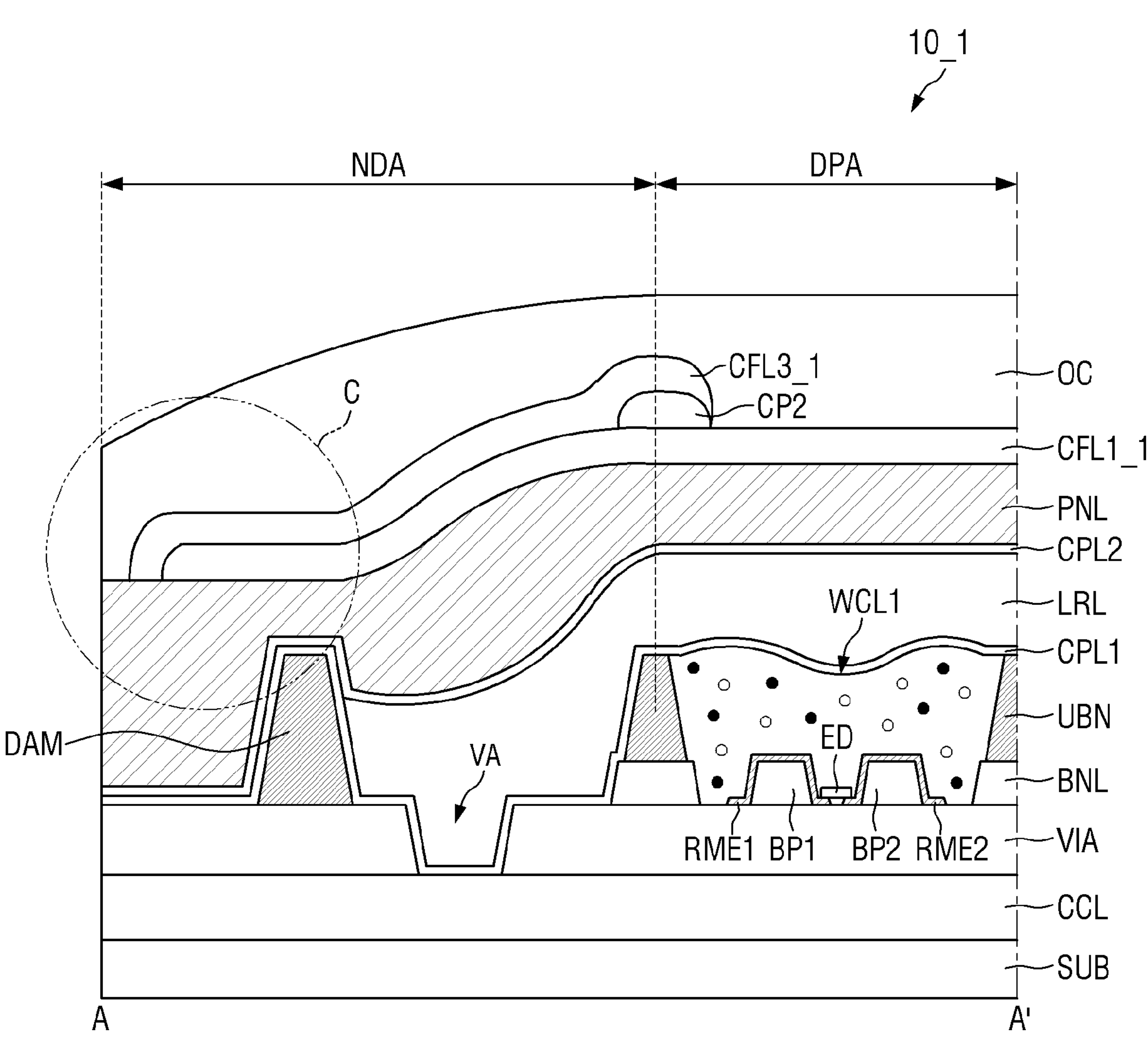
FIG. 13 is a schematic cross-sectional view illustrating a display area and a non-display area of a display device according to an embodiment.
Figure 14:
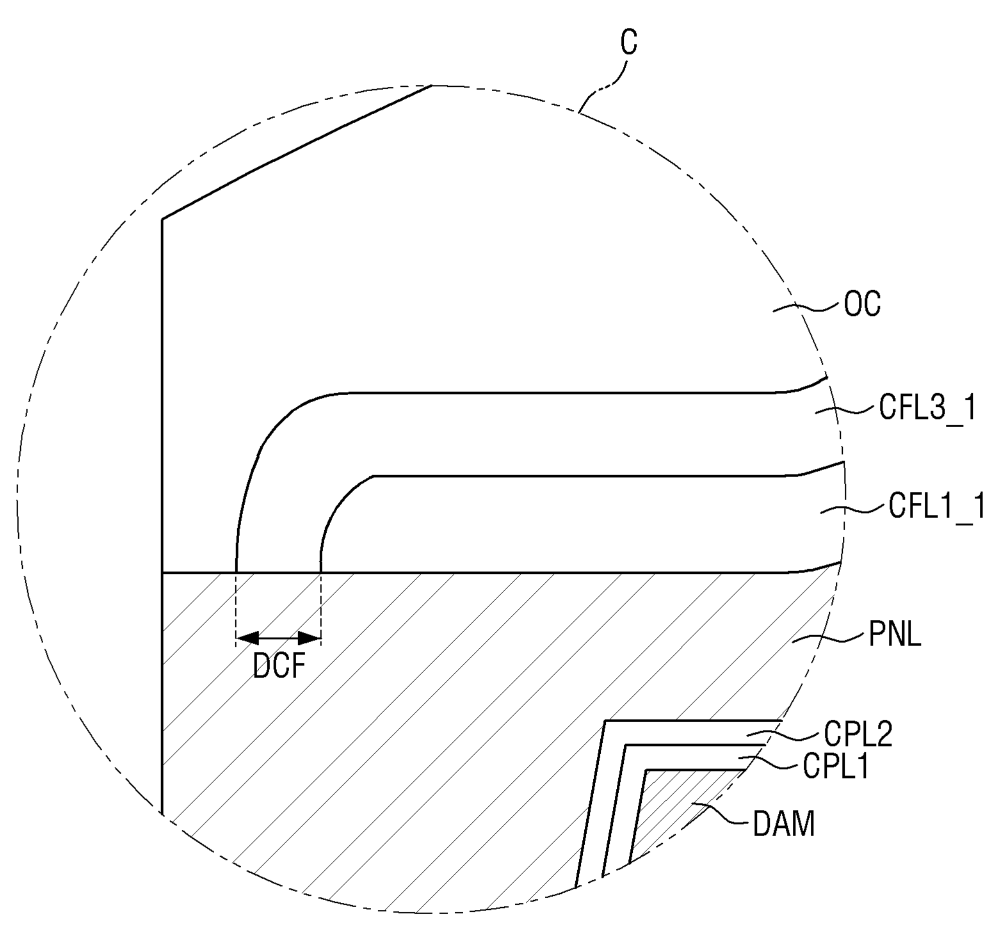
FIG. 14 is a schematic enlarged view of part C of FIG. 13.

FIG. 13 is a schematic cross-sectional view illustrating a display area and a non-display area of a display device according to an embodiment. FIG. 14 is a schematic enlarged view of part C of FIG. 13.

Referring to FIGS. 13 and 14, in a display device 10_1 according to an embodiment, including color filter layers CFL1_1 and CFL3_1 extending to the non-display area NDA, a third color filter layer CFL3_1 disposed in the upper portion may extend more outward than a first color filter layer CFL1_1.

The outer edges of the first color filter layer CFL1_1 and the third color filter layer CFL3_1 disposed in the non-display area NDA may not overlap each other. The third color filter layer CFL3_1 may be disposed on the first color filter layer CFL1_1 in the non-display area NDA and may cover the outermost edge of the first color filter layer CFL1_1. The outermost edge of the third color filter layer CFL3_1 may extend beyond the outermost edge of the first color filter layer CFL1_1 by a distance DCF to be disposed (e.g., directly disposed) on the planarization layer PNL. However, the third color filter layer CFL3_1 may not be disposed on the outermost edge of the planarization layer PNL, but may be spaced apart therefrom inward by a distance. A separation distance from the outermost edge of the display device 10 to the outer edge of the first color filter layer CFL1_1 may be greater than a separation distance from the outermost edge of the display device 10 to the outer edge of the third color filter layer CFL3_1.

As described above, the first color filter layer CFL1_1 and the third color filter layer CFL3_1 in the non-display area NDA may have the outermost edges that do not overlap each other. In the embodiment of FIG. 9, the first color filter layer CFL1 disposed in the lower portion may further extend outward, but embodiments are not limited thereto. In the display device 10_1, the third color filter layer CFL3_1 disposed in the upper portion may extend more outward than the first color filter layer CFL1_1 to cover the outermost edge of the first color filter layer CFL1_1.

Figure 15:
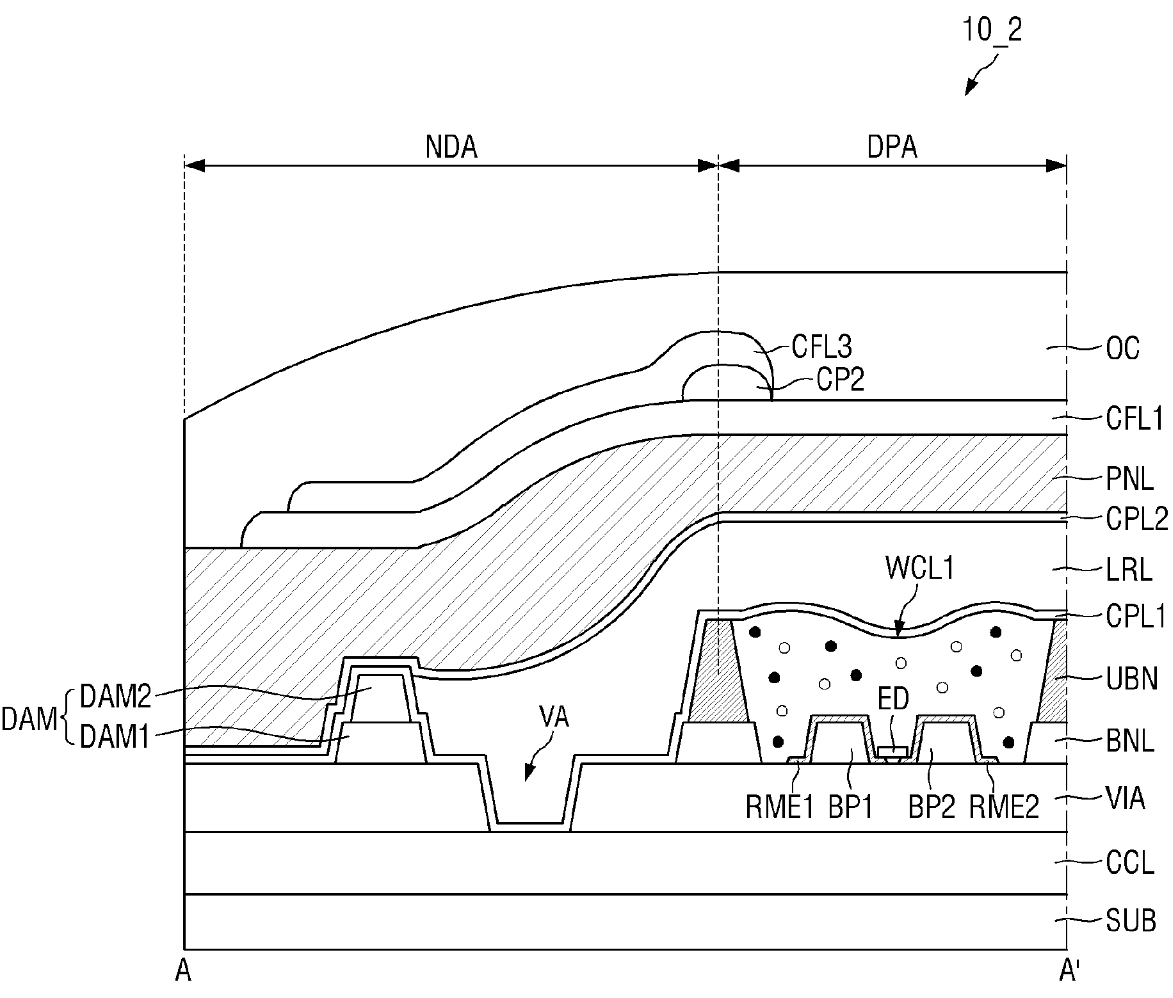
FIGS. 15 and 16 are schematic cross-sectional views illustrating a display area and a non-display area of a display device according to an embodiment.
Figure 16:
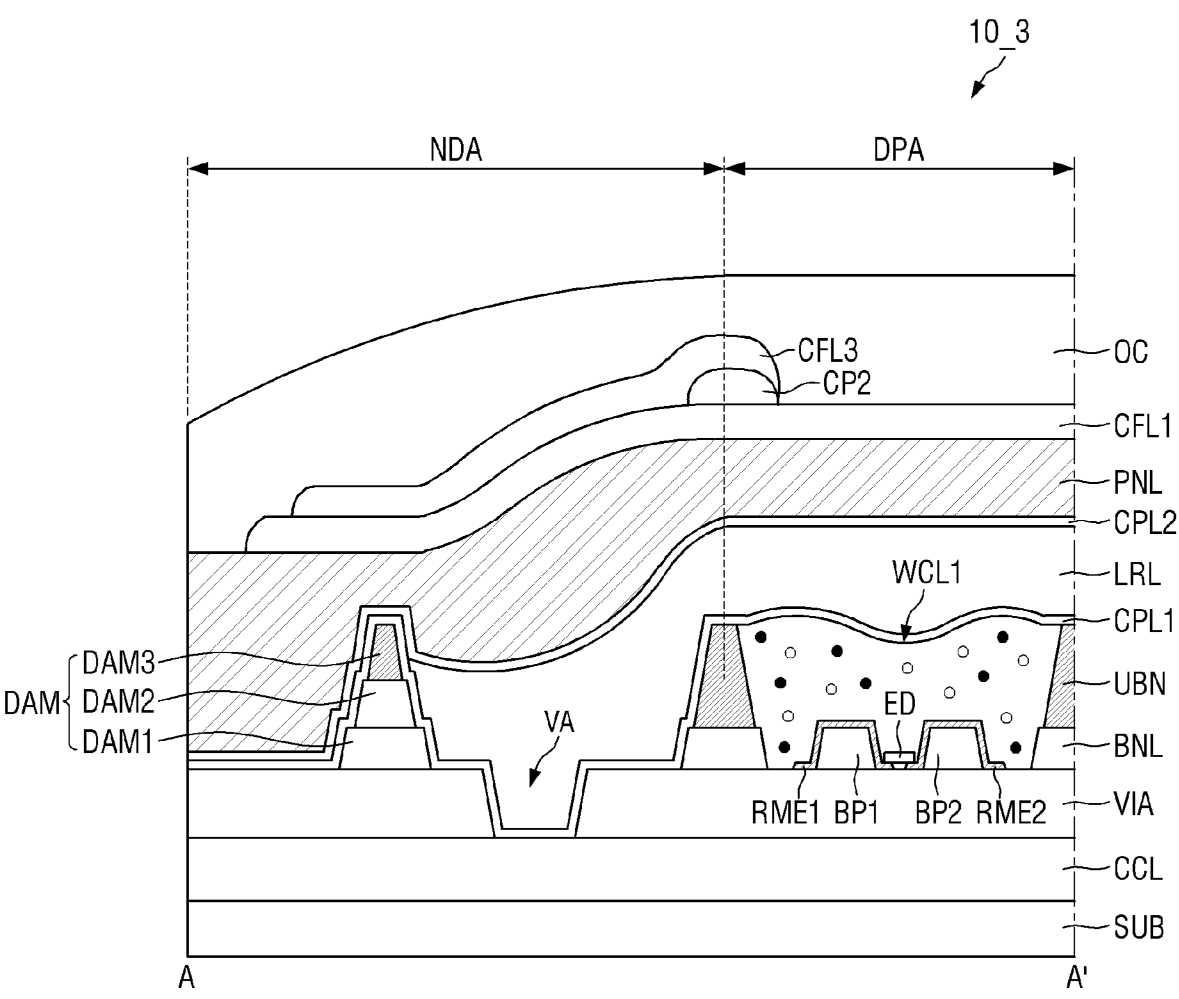

FIGS. 15 and 16 are schematic cross-sectional views illustrating a display area and a non-display area of a display device according to an embodiment.

Referring to FIGS. 15 and 16, in display devices 10_2 and 10_3 according to an embodiment, the dam member DAM may be formed of layers. In the display device 10_2 of FIG. 15, the dam member DAM may include a first dam layer DAM1 and a second dam layer DAM2, and in the display device 10_3 of FIG. 16, the dam member DAM may include a first dam layer DAM1, a second dam layer DAM2, and a third dam layer DAM3. Each of the first, second, and third dam layers DAM1, DAM2, and DAM3 of the dam member DAM and the bank patterns BP1 and BP2, the bank layer BNL, and the upper bank layer UBN disposed in the display area DPA may include the same material. Each of the first, second, and third dam layers DAM1, DAM2, and DAM3 of the dam member DAM may be formed simultaneously with them.

For example, in the display device 10_2 of FIG. 15, the dam member DAM may include the first dam layer DAM1 and the second dam layer DAM2 disposed on the first dam layer DAM1. For example, the first dam layer DAM1 and the bank patterns BP1 and BP2 may be formed in the same process. For example, the second dam layer DAM2 and the bank layer BNL may be formed in the same process. The first dam layer DAM1 of the dam member DAM may be disposed (e.g., directly disposed) on the via layer VIA, similarly to the bank patterns BP1 and BP2. Unlike the bank patterns BP1 and BP2 and the bank layer BNL that do not overlap in the display area DPA, the second dam layer DAM2 of the dam member DAM may be disposed on the first dam layer DAM1 with being formed simultaneously with the bank layer BNL.

In the display device 10_3 of FIG. 16, the dam member DAM may further include the third dam layer DAM3 formed in the same process as the upper bank layer UBN, in addition to the first dam layer DAM1 and the second dam layer DAM2.

In the display devices 10_2 and 10_3 of FIGS. 15 and 16, since the dam members DAM are formed in the same process, by which the layers disposed in the display area DPA are formed, there is an advantage in that a process for forming a separate dam member DAM is reduced in the manufacturing process.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:

a substrate comprising a display area and a non-display area surrounding the display area;

a plurality of sub-pixels comprising a plurality of light emitting elements disposed on a surface of the substrate in the display area, the plurality of sub-pixels comprising a first sub-pixel and a second sub-pixel;

an upper bank layer surrounding the plurality of sub-pixels and the display area;

a plurality of color control members disposed in a region surrounded by the upper bank layer in each of the plurality of sub-pixels, the plurality of color control members comprising:

a first wavelength conversion layer disposed in the first sub-pixel, and a second wavelength conversion layer disposed in the second sub-pixel different from the first sub-pixel;

a plurality of color filter layers disposed on the plurality of color control members, the plurality of color filter layers comprising:

a first color filter layer disposed on the first wavelength conversion layer, a second color filter layer disposed on the second wavelength conversion layer, and a third color filter layer;

a dam member spaced apart from the upper bank layer, the dam member surrounding the display area in the non-display area; and a valley disposed between the dam member and the upper bank layer, the valley surrounding the display area, wherein the first color filter layer extends from the display area to the non-display area, the third color filter layer is disposed on the first color filter layer disposed in the non-display area, each of the first color filter layer and the third color filter layer extends to an outside of the dam member, and an outermost edge of the first color filter layer disposed in the non-display area is spaced apart from an outermost edge of the third color filter layer disposed in the non-display area in a direction along the surface of the substrate.

2. The display device of claim 1, wherein the first color filter layer and the third color filter layer overlap each other in a thickness direction at a boundary area between the first sub-pixel and the non-display area.

3. The display device of claim 2, further comprising a color pattern disposed between the first color filter layer and the third color filter layer at the boundary area between the first sub-pixel and the non-display area, wherein the color pattern and the second color filter layer include a same colorant.

4. The display device of claim 1, wherein a distance between an outermost edge of the non-display area and the outermost edge of the first color filter layer is smaller than a distance between the outermost edge of the non-display area and the outermost edge of the third color filter layer.

5. The display device of claim 1, wherein the outermost edge of the third color filter layer disposed in the non-display area covers the outermost edge of the first color filter layer disposed in the non-display area, and the outermost edge of the third color filter layer does not overlap the outermost edge of the first color filter layer in a thickness direction.

6. The display device of claim 1, wherein the first color filter layer includes a red colorant, and the third color filter layer includes a blue colorant.

7. The display device of claim 1, wherein the dam member is a single layer and disposed in the non-display area.

8. The display device of claim 1, wherein the plurality of sub-pixels comprise a third sub-pixel different from the first sub-pixel and the second sub-pixel, the plurality of color control members further comprise a light transmitting layer disposed in the third sub-pixel, and the third color filter layer is disposed on the light transmitting layer in the third sub-pixel.

9. The display device of claim 1, further comprising:

a first capping layer disposed on the plurality of color control members and the upper bank layer;

a low refractive layer disposed on the first capping layer;

a second capping layer disposed on the low refractive layer; and a planarization layer disposed on the second capping layer, wherein the first capping layer, the second capping layer, and the planarization layer are disposed across the display area and the non-display area.

10. The display device of claim 9, wherein the low refractive layer is disposed in a region surrounded by the dam member, the first capping layer is disposed on the valley and the dam member, and the second capping layer is in direct contact with the first capping layer on the dam member.

11. The display device of claim 9, wherein the plurality of color filter layers are disposed directly on the planarization layer, and the first color filter layer and the third color filter layer disposed in the non-display area are disposed on the planarization layer at an outside of the dam member.

12. The display device of claim 1, further comprising a bank layer surrounding each of the plurality of sub-pixels and the display area, wherein the upper bank layer is disposed on the bank layer.

13. The display device of claim 12, wherein each of the plurality of sub-pixels comprise a first electrode and a second electrode spaced apart from each other in a region surrounded by the bank layer, and each of the plurality of light emitting elements of the plurality of sub-pixels has a first end disposed on the first electrode and a second end disposed on the second electrode.

14. A display device comprising:

a display area and a non-display area surrounding the display area;

a plurality of sub-pixels disposed in the display area and arranged in a first direction and a second direction intersecting the first direction, each of the plurality of sub-pixels comprising:

a first electrode, a second electrode spaced apart from the first electrode, and a light emitting element including a first end disposed on the first electrode and a second end disposed on the second electrode;

an upper bank layer surrounding the display area, the upper bank layer surrounding a light transmitting area of each of the plurality of sub-pixels;

a plurality of color filter layers disposed in the light transmitting area of each of the plurality of sub-pixels and in a light blocking area overlapping the upper bank layer around the light transmitting area of each of the plurality of sub-pixels;

a dam member spaced apart from the upper bank layer and disposed in the non-display area, the dam member surrounding the display area; and a valley disposed between the dam member and the upper bank layer in a plan view, the valley surrounding the display area, wherein the plurality of color filter layers comprise:

a first color filter layer disposed in an outermost sub-pixel among the plurality of sub-pixels and extending to the non-display area, and a second color filter layer including a colorant different from a colorant of the first color filter layer, the second color filter layer disposed on the first color filter layer without being disposed in the light transmitting area of the outermost sub-pixel, an outermost edge of the first color filter layer is spaced apart from an outermost edge of the second color filter layer, the outermost edge of the first color filter layer is disposed at an outside of the dam member, and the outermost edge of the second color filter layer is disposed between the dam member and the outermost edge of the first color filter layer in a plan view.

15. The display device of claim 14, wherein the first color filter layer and the second color filter layer overlap each other in the light blocking area.

16. The display device of claim 15, further comprising:

a color pattern disposed between the first color filter layer and the second color filter layer in the light blocking area, wherein the color pattern includes a colorant different from colorants of the first color filter layer and the second color filter layer.

* * * * *